(12) United States Patent
Ching et al.

(10) Patent No.: US 9,741,821 B1
(45) Date of Patent: Aug. 22, 2017

(54) TWO-STEP DUMMY GATE FORMATION

(71) Applicant: Taiwan Semiconductor Manufacturing Company, Ltd., Hsin-Chu (TW)

(72) Inventors: Kuo-Cheng Ching, Zhubei (TW); Kuan-Ting Pan, Hsin-Chu (TW); Chih-Hao Wang, Baoshan Township (TW); Ying-Keung Leung, Hsinchu (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/202,124

(22) Filed: Jul. 5, 2016

Related U.S. Application Data

(60) Provisional application No. 62/312,718, filed on Mar. 24, 2016.

(51) Int. Cl.
| | |
|---|---|
| *H01L 29/66* | (2006.01) |
| *H01L 29/78* | (2006.01) |
| *H01L 29/06* | (2006.01) |
| *H01L 29/08* | (2006.01) |
| *H01L 29/24* | (2006.01) |
| *H01L 29/161* | (2006.01) |

(52) U.S. Cl.
CPC .... *H01L 29/66545* (2013.01); *H01L 29/0653* (2013.01); *H01L 29/0847* (2013.01); *H01L 29/161* (2013.01); *H01L 29/24* (2013.01); *H01L 29/7851* (2013.01)

(58) Field of Classification Search
CPC .......... H01L 29/66545; H01L 29/6681; H01L 29/66795
See application file for complete search history.

(56) References Cited

U.S. PATENT DOCUMENTS

| | | | |
|---|---|---|---|
| 8,258,587 | B2 | 9/2012 | Masuoka et al. |
| 8,487,378 | B2 | 7/2013 | Goto et al. |
| 8,729,634 | B2 | 5/2014 | Shen et al. |
| 8,826,213 | B1 | 9/2014 | Ho et al. |

(Continued)

FOREIGN PATENT DOCUMENTS

| | | |
|---|---|---|
| TW | 201312636 A | 3/2013 |
| TW | 201541525 A | 11/2015 |

*Primary Examiner* — Thao P Le
(74) *Attorney, Agent, or Firm* — Slater Matsil, LLP

(57) ABSTRACT

A method includes forming isolation regions extending into a semiconductor substrate, and recessing the isolation regions. A portion of the semiconductor substrate between the isolation regions protrudes higher than the isolation regions to form a semiconductor fin. A dummy gate electrode is formed to cover a middle portion of the semiconductor fin, with an end portion of the semiconductor fin uncovered by the dummy gate electrode. The dummy gate electrode includes a lower dummy gate electrode portion, and an upper dummy gate electrode portion including polysilicon over the lower dummy gate electrode portion. The lower dummy gate electrode portion and the upper dummy gate electrode portion are formed of different materials. Source/drain regions are formed on opposite sides of the dummy gate electrode. The dummy gate electrode is replaced with a replacement gate electrode.

20 Claims, 24 Drawing Sheets

(56) References Cited

U.S. PATENT DOCUMENTS

| | | | |
|---|---|---|---|
| 8,887,106 B2 | 11/2014 | Ho et al. | |
| 9,209,185 B2 | 12/2015 | Ching et al. | |
| 9,490,332 B1* | 11/2016 | Balakrishnan | H01L 29/41791 |
| 2014/0001559 A1* | 1/2014 | Lin | H01L 29/66795 |
| | | | 257/368 |
| 2014/0282326 A1 | 9/2014 | Chen et al. | |
| 2015/0279995 A1* | 10/2015 | Maeda | H01L 29/7848 |
| | | | 257/192 |
| 2016/0276466 A1* | 9/2016 | Leobandung | H01L 29/66795 |
| 2016/0322497 A1* | 11/2016 | Huang | H01L 29/7848 |

* cited by examiner

TWO-STEP DUMMY GATE FORMATION

PRIORITY CLAIM AND CROSS-REFERENCE

This application claims the benefit of the following provisionally filed U.S. Patent Application Ser. No. 62/312,719, filed Mar. 24, 2016, and entitled "Two Step Dummy Gate Fill and Pattern with Void and Seam Free;" which application is hereby incorporated herein by reference.

BACKGROUND

Technological advances in Integrated Circuit (IC) materials and design have produced generations of ICs where each generation has smaller and more complex circuits than the previous generations. In the course of IC evolution, functional density (for example, the number of interconnected devices per chip area) has generally increased while geometry sizes have decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, Fin Field-Effect Transistors (FinFETs) have been introduced to replace planar transistors. The structures of FinFETs and methods of fabricating FinFETs are being developed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
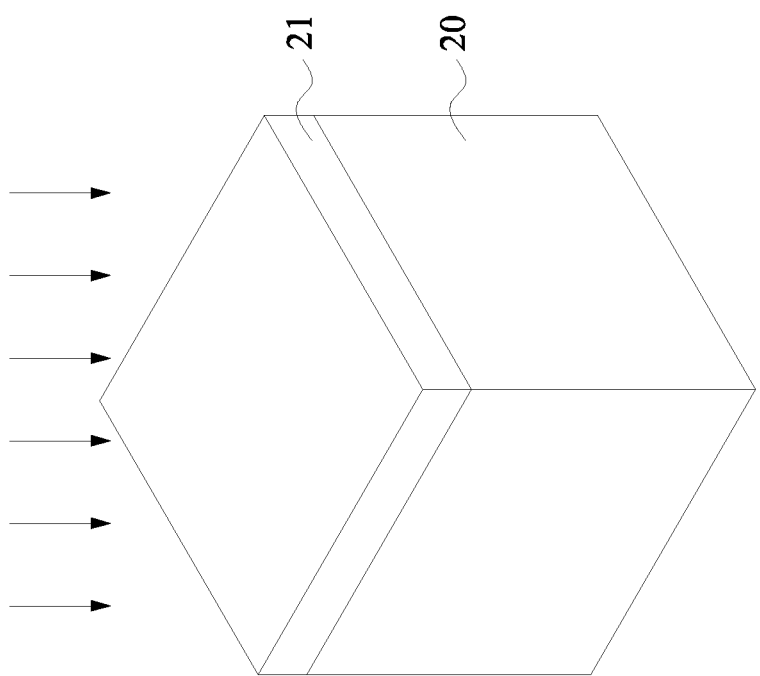
FIGS. 1 through 15 are perspective views and cross-sectional views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and the methods of forming the same are provided in accordance with various exemplary embodiments. The intermediate stages of forming the FinFETs are illustrated. The variations of the embodiments are discussed. Throughout the various views and illustrative embodiments, like reference numbers are used to designate like elements.

Figure 32:
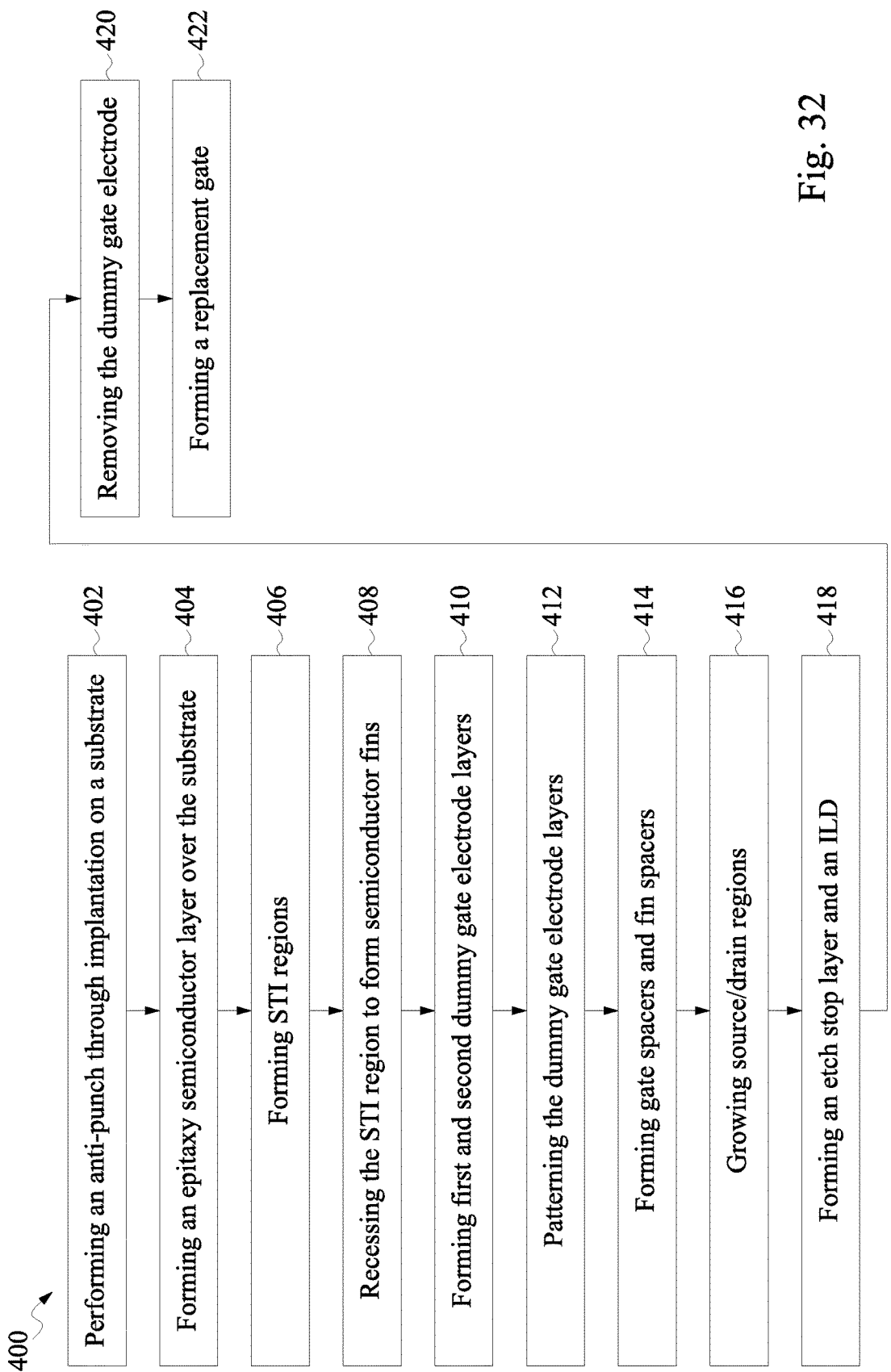
FIG. 32 illustrates a process flow for forming FinFETs in accordance with some embodiments.

FIGS. 1 through 15 illustrate the perspective views and cross-sectional views of intermediate stages in the formation of a FinFET in accordance with some embodiments. The steps shown in FIG. 1 through 15 are also illustrated schematically in the process flow 400 shown in FIG. 32. In the subsequent discussion, the process steps shown in FIGS. 1 through 15 are discussed referring to the process steps in FIG. 32.

FIG. 1 illustrates a perspective view of substrate 20, which may be a part of a wafer. Substrate 20 may be a semiconductor substrate, such as a silicon substrate, a silicon carbon substrate, a silicon-on-insulator substrate or a substrate formed of other semiconductor materials. Substrate 20 may be lightly doped with a p-type or an n-type impurity. An Anti-Punch-Through (APT) implantation (illustrated by arrows) is preformed on a top portion of substrate 20 to form APT region 21. The respective step is shown as step 402 in the process flow shown in FIG. 32. The conductivity type of the dopants implanted during the APT implantation is opposite to that of the source/drain region (not shown) of the respective FinFET to be formed. APT layer 21 extends under the subsequently formed source/drain regions in the resulting FinFET, which will be formed in subsequent steps, and is used to reduce the leakage from the source/drain regions to substrate 20. The doping concentration in APT layer 21 may be in the range between about $1E18/cm^3$ and about $1E19/cm^3$ in accordance with some exemplary embodiments. For clarity, in subsequent drawings, APT region 21 may not be illustrated.

Figure 2:
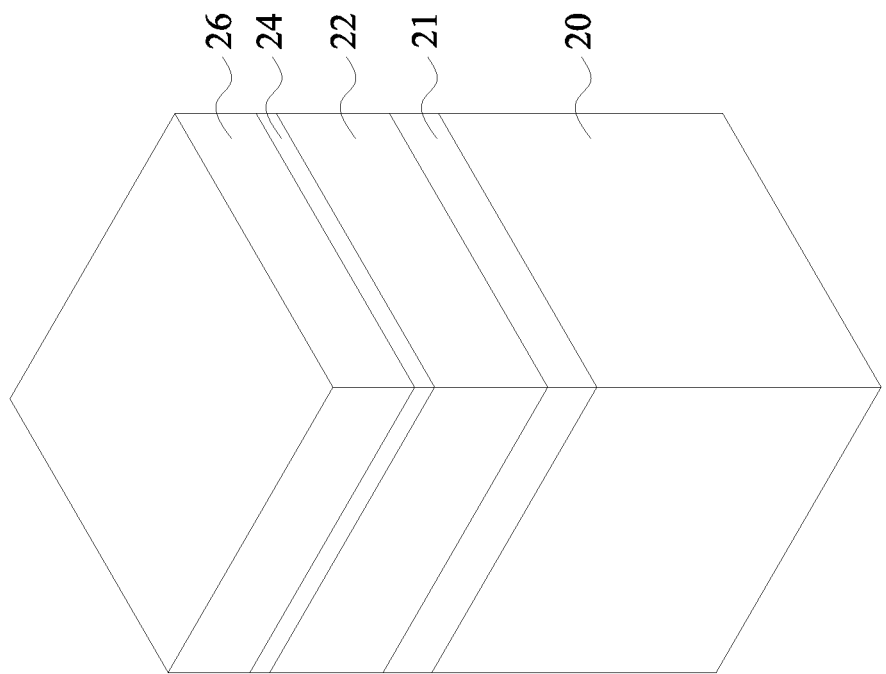

Referring to FIG. 2, epitaxy semiconductor layer 22 is grown on substrate 20 through epitaxy. The respective step is shown as step 404 in the process flow shown in FIG. 32. Throughout the description, epitaxy semiconductor layer 22 and substrate 20 in combination are also be referred to as a semiconductor substrate. Epitaxy semiconductor layer 22 may include silicon germanium (SiGe), silicon carbon, or silicon (free from germanium and carbon). When formed of SiGe, the germanium percentage (atomic percentage) of epitaxy semiconductor layer 22 may be in the range between about 25 percent and about 35 percent, while higher or lower germanium percentages may be used. It is appreciated, however, that the values recited throughout the description are examples, and may be changed to different values.

Pad oxide 24 and hard mask 26 are formed over epitaxy semiconductor layer 22. In accordance with some embodiments of the present disclosure, pad oxide 24 is formed of silicon oxide, which may be formed by oxidizing a surface layer of semiconductor layer 22. Hard mask 26 may be formed of silicon nitride, silicon oxynitride, silicon carbide, silicon carbo-nitride, or the like.

Figure 3:
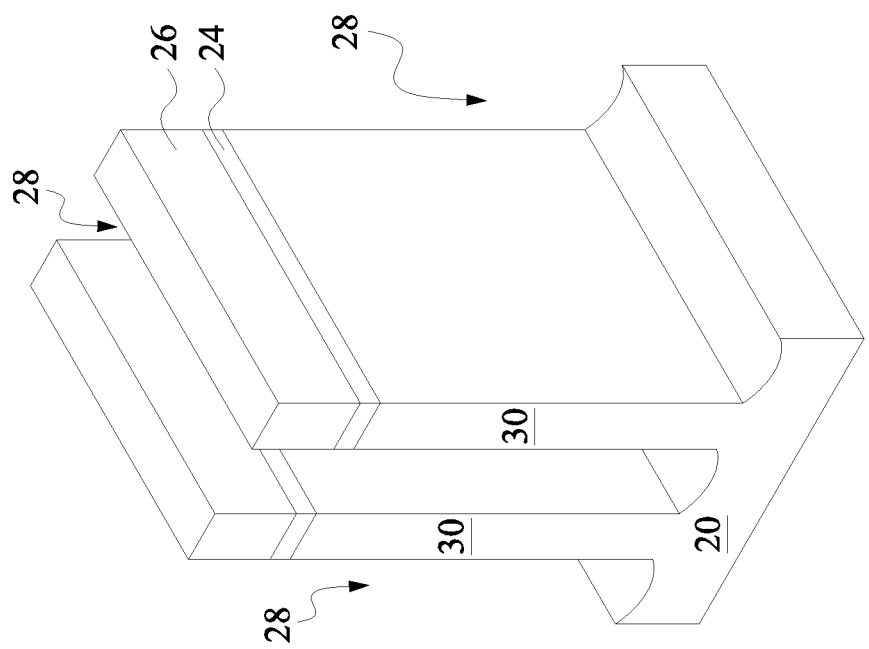

Next, as shown in FIG. 3, hard mask 26, pad oxide 24, semiconductor layer 22, and substrate 20 are patterned to form trenches 28. Accordingly, semiconductor strips 30 are formed. Trenches 28 extend into semiconductor layer 22 and substrate 20, and have lengthwise directions parallel to each other.

Figure 4:
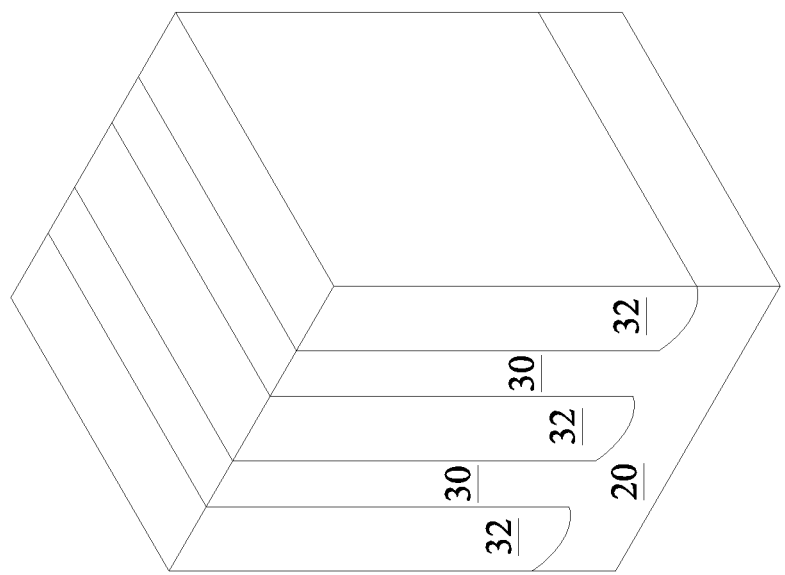

Next, as shown in FIG. 4, isolation regions 32, which are alternatively referred to as Shallow Trench Isolation (STI) regions, are formed in trenches 28 (FIG. 3). The respective step is shown as step 406 in the process flow shown in FIG. 32. The formation may include filling trenches 28 with a dielectric layer(s), for example, using Flowable Chemical Vapor Deposition (FCVD), and performing a Chemical Mechanical Polish (CMP) to level the top surface of the dielectric material with the top surface of hard mask 26 or the top surfaces of isolation regions 32. After the CMP, hard mask 26 and pad oxide 24 (FIG. 3) are removed.

Figure 5:
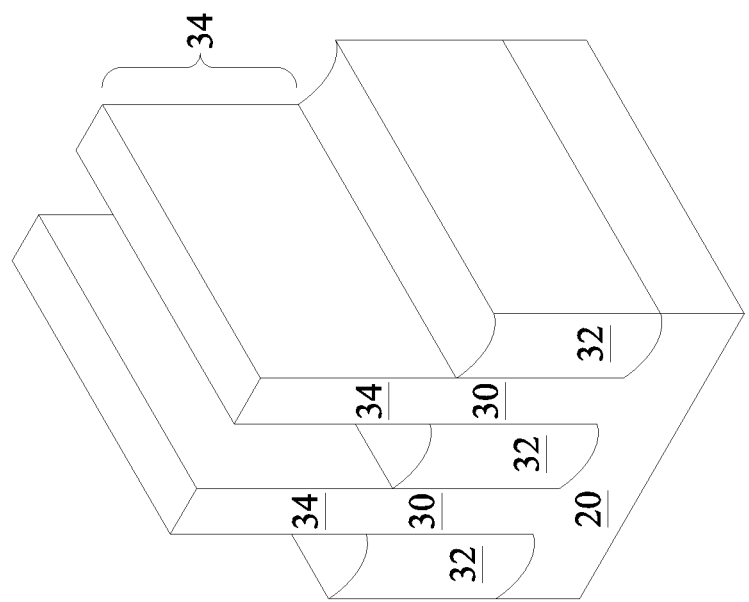

Next, referring to FIG. 5, STI regions 32 are recessed, so that the top surfaces of the resulting STI regions 32 are lower than the top surface of semiconductor strips 30. The respective step is shown as step 408 in the process flow shown in FIG. 32. Throughout the description, the upper portions of semiconductor strips 30, which upper portions are higher than the top surfaces of STI regions 32, are referred to as semiconductor fins 34, while the lower portions of semiconductor strips 30 lower than the top surfaces of STI regions 32 remain to be referred to as semiconductor strips 30.

Figure 6:
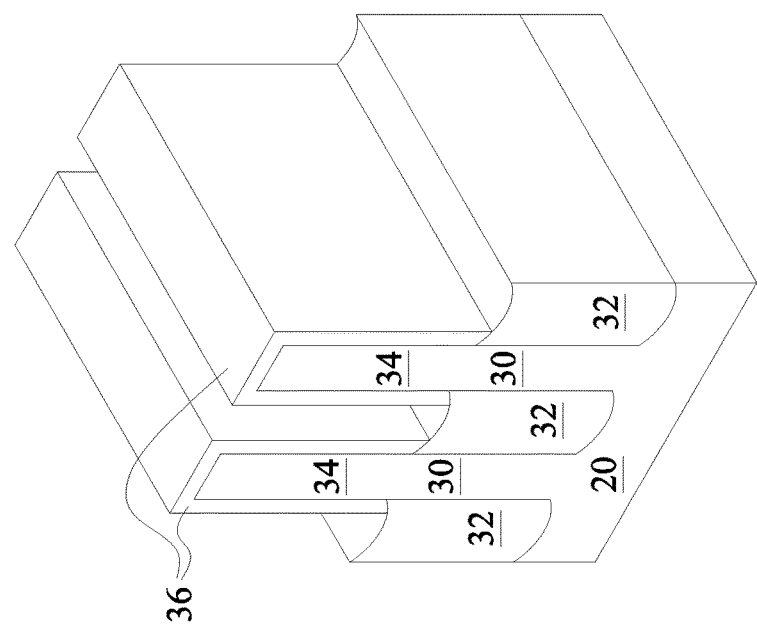

FIG. 6 illustrates the formation of dummy oxide (dummy gate dielectric) 36, which may include silicon oxide in accordance with some embodiments. Dummy oxide 36 may be formed through deposition or oxidizing the surface layers of semiconductor fins 34. Accordingly, dummy oxide 36 may or may not extend on the top surfaces of STI regions 32.

Figure 7:
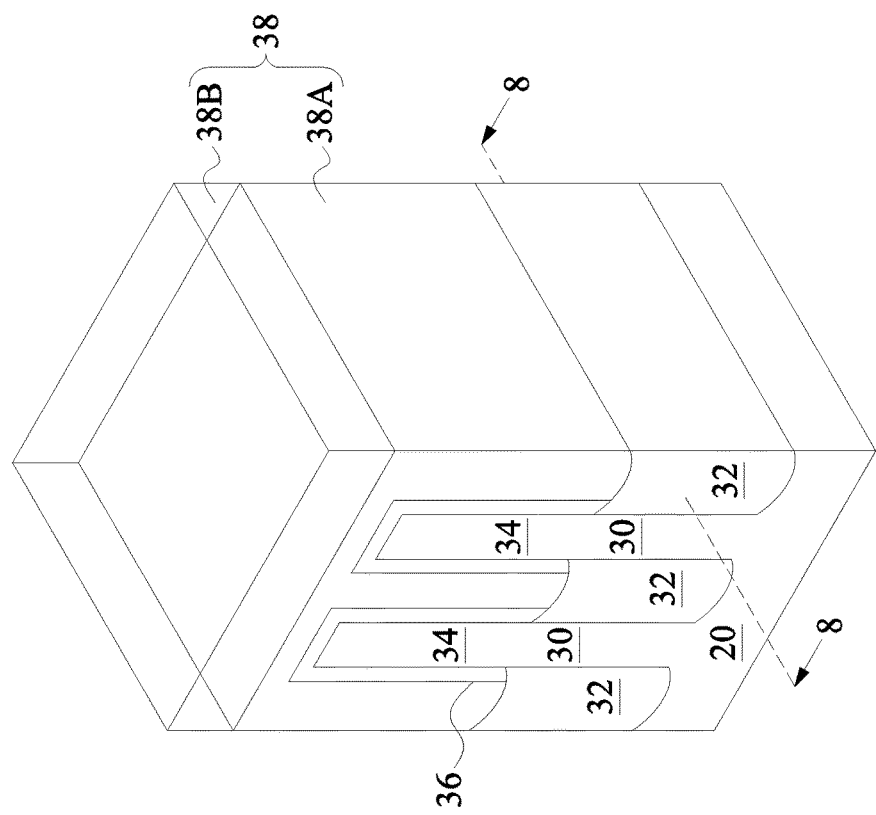

FIG. 7 illustrate the two-step formation of dummy gate electrode layer 38, which includes dummy gate electrode layers 38A and 38B, collectively referred to as gate electrode layer 38. The respective step is shown as step 410 in the process flow shown in FIG. 32. In accordance with some embodiments of the present disclosure, in the first step, dummy gate electrode layer 38A is formed. Dummy gate electrode layer 38A is formed of a material and using a method that have better filling capability than polysilicon. In accordance with some embodiments of the present disclosure, dummy gate electrode layer 38A is formed of silicon nitride, which may be formed using Atomic Layer Deposition (ALD). In accordance with alternative embodiments, dummy gate electrode layer 38A is formed of spin-coating carbon, which comprises carbon. In accordance with yet alternative embodiments, dummy gate electrode layer 38A is formed of spin-on glass, which comprises an oxide. The resulting dummy gate electrode layer 38A is thus seam-free and void-free.

Dummy gate electrode layer 38A is formed with its lowest level higher than the top surfaces of dummy oxide 36. A planarization (such as a Chemical Mechanical Polish (CMP)) is then preformed to level the top surface of dummy gate electrode layer 38A. Next, dummy gate electrode layer 38B is formed over dummy gate electrode layer 38A, which is formed using a material different from that of dummy gate electrode layer 38A. In accordance with some embodiments of the present disclosure, dummy gate electrode layer 38B is formed of polysilicon, which may be formed using, for example, furnace Chemical Vapor Deposition (CVD). The top and bottom surfaces of dummy gate electrode layer 38B are substantially planar.

Figure 9:
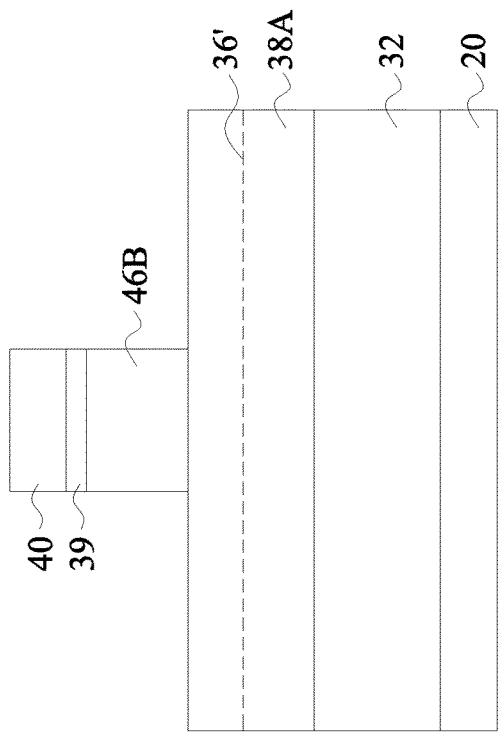
Figure 8:
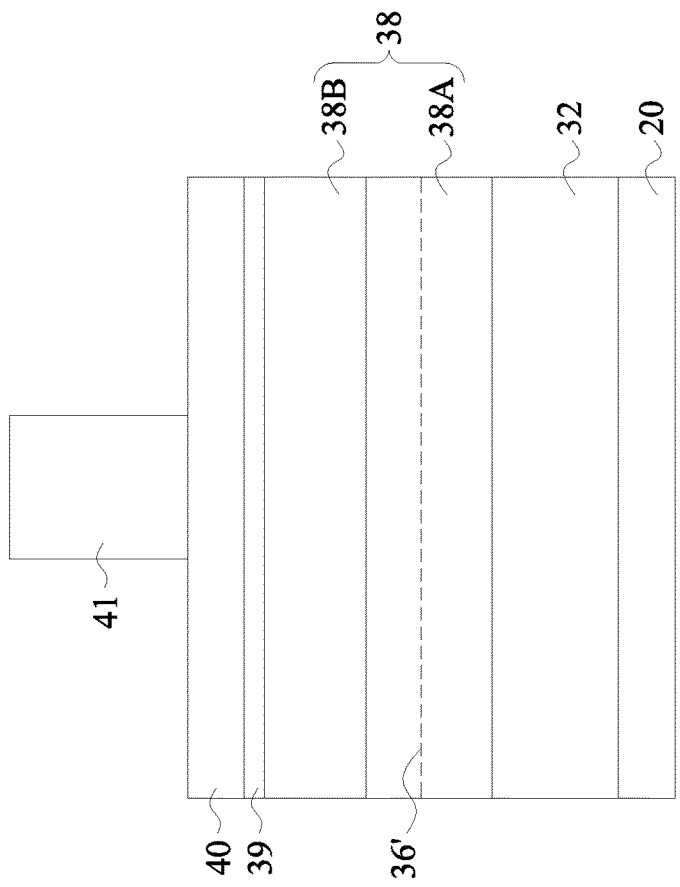

After the formation, gate electrode layers 38A and 38B are patterned in a two-step patterning process, as shown in FIGS. 8 through 10. The respective step is shown as step 412 in the process flow shown in FIG. 32. The cross-sectional views shown in FIGS. 8 through 10 are obtained from the vertical plane containing line 8-8 in FIG. 7. Referring to FIG. 8, in accordance with some embodiments of the present disclosure, before the patterning, pad oxide 39 and hard mask 40 are formed, whose materials may be essentially the same as that of pad oxide 24 and hard mask 26 (FIG. 3). Photo resist 41 is then formed and patterned. In FIG. 8, dashed line 36' is illustrated to show the position of the top surface of dummy oxide 36.

Hard mask 40 and pad oxide 39 are then patterned. Photo resist 41 is removed, and the resulting structure is shown in FIG. 9. FIG. 9 also illustrates the etching of dummy gate electrode layer 38B (FIG. 8) using an anisotropic etching method. The remaining portion of dummy gate electrode layer 38B is referred to as dummy gate electrode portion 46B hereinafter. The step shown in FIG. 9 is referred to as a first etching for forming the dummy gate. The etchant gas is selected depending on the material of dummy gate electrode layer 38B, and may include a mixture of chlorine ($Cl_2$) and nitrogen ($N_2$), or a mixture of fluorine ($F_2$) and nitrogen ($N_2$) when dummy gate electrode layer 38B is formed of polysilicon.

Figure 10B:
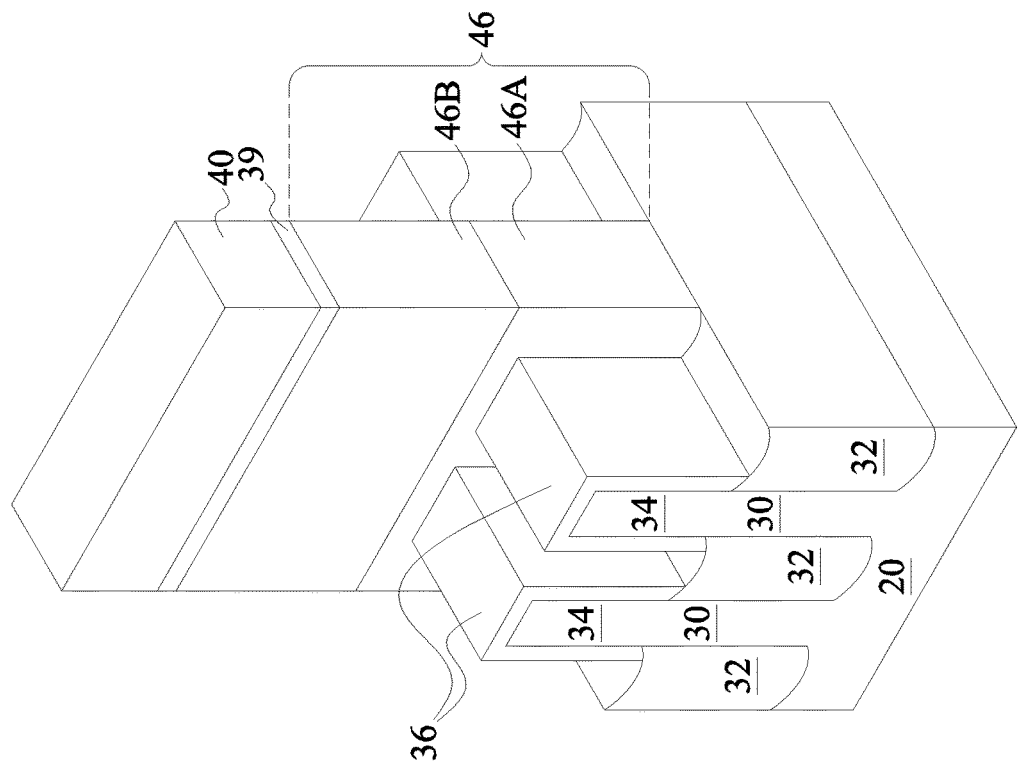
Figure 10A:
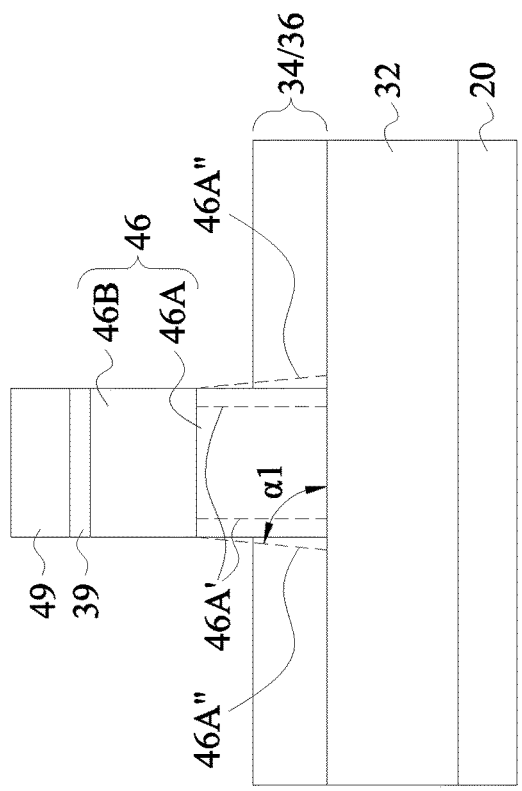

FIG. 10A illustrates a second etching step for forming the dummy gate electrode. Dummy gate electrode layer 38A as shown in FIG. 9 is etched/patterned, which is performed using an etching gas suitable for etching dummy gate electrode layer 38A. The etching gas may be the same as or different from the etching gas used for etching dummy gate electrode layer 38B, depending on the material of dummy gate electrode layer 38A. For example, when dummy gate electrode layer 38A is formed of silicon nitride, hydrogen fluoride (HF) gas may be used. When dummy gate electrode layer 38A is formed of (spin coating) carbon, oxygen ($O_2$) may be used. The remaining portion of dummy gate electrode layer 38A is referred to as dummy gate electrode portion 46A hereinafter. Dummy gate electrode portions 46A and 46B are collectively referred to as dummy gate electrode 46 hereinafter. After dummy gate electrode 46 is formed, the top surface of STI regions 32 are exposed, and dummy oxide 36 are also exposed, as shown in FIG. 10A. It is appreciated that semiconductor fin 34 and dummy oxide 36 are in a different plane than the illustrated STI region 32.

Referring again to FIG. 10A, since dummy gate electrode layer 38A (FIGS. 8 and 9) may be more difficult to etch (due to the material) than dummy gate electrode layer 38A, the respective etching gas is selected to have a strong etching effect. As a result, the sidewalls of dummy gate electrode portion 46A may be recessed from the respective edges of dummy gate electrode portion 46B. This may be due to the low etching rate of dummy gate electrode portion 46B in response to the etching gas, and the strong effect of etching dummy gate electrode layer 38A. Dashed lines 46A' schematically illustrate the respective edges of dummy gate electrode portion 46A. Also, dummy gate electrode portion 46A may have edges as shown by dashed lines 46A", which edges being straight in the cross-sectional view, and are slanted (for example, with tilt angle α1 being smaller than about 85 degrees). Dummy gate electrode portion 46B may also have substantially vertical (for example, with tilt angle α2 being greater than about 88 degrees and smaller than or equal to 90 degrees). In FIG. 10A, tilt angle α2 may be greater than tilt angle α1, with a difference being greater than about 3 degrees and possibly between about 3 degrees and about 10 degrees in accordance with some embodiments. FIG. 10B illustrates a perspective view of the same structure shown in FIG. 10A.

Figure 12:
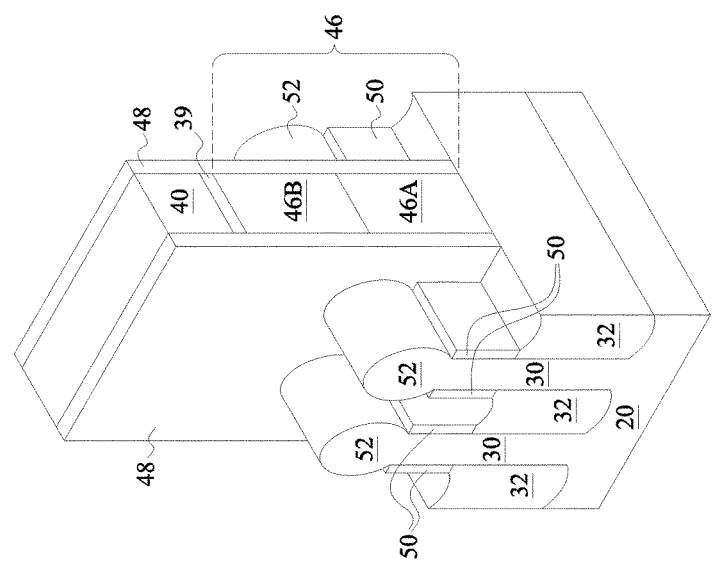
Figure 11:
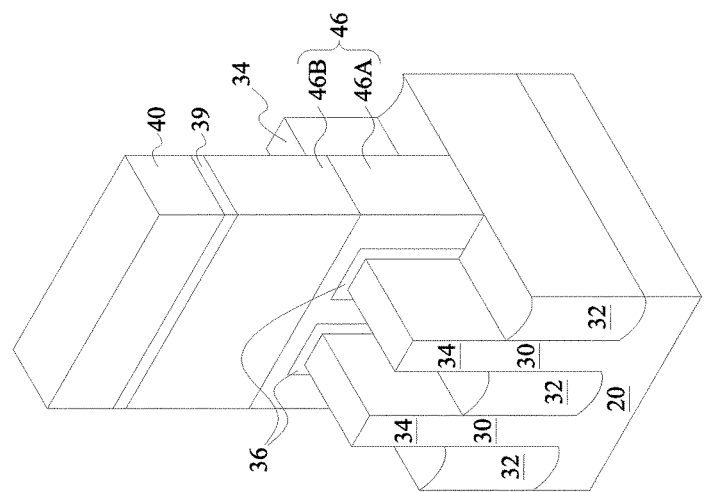

Referring to FIG. 11, the exposed portions of dummy oxide 36 that are not covered by dummy gate electrode 46 are removed in an etching step. Next, as shown in FIG. 12, a plurality of process steps is performed. First, gate spacers 48 and fin spacers 50 are formed. The respective step is shown as step 414 in the process flow shown in FIG. 32. Gate spacers 48 are formed on the sidewalls of dummy gate electrode 46. In accordance with some embodiments of the present disclosure, gate spacers 48 and fin spacers 50 are formed by conformably depositing a dielectric layer(s), and then performing an anisotropic etching to remove horizontal portions of the dielectric layer(s), leaving vertical portions of the dielectric layer(s). In accordance with some embodiments, gate spacers 48 and fin spacers 50 are formed of silicon nitride, and may have a single-layer structure. In accordance with alternative embodiments, gate spacers 48 and fin spacers 50 have a composite structure including a plurality of layers. For example, gate spacers 48 may include a silicon oxide layer, and a silicon nitride layer over the silicon oxide layer. Dummy gate electrode 46 and gate spacers 48 cover a middle portion of each of semiconductor fins 34, leaving the opposite end portions not covered.

In a subsequent step, the end portions of semiconductor fins 34 (refer to FIG. 11) are etched, for example, in a dry etch or wet etch step. Next, epitaxy regions (source/drain regions) 52 are formed by selectively growing a semiconductor material from the recesses left by the etched end portions of semiconductor fins 34. The respective step is shown as step 416 in the process flow shown in FIG. 32. In accordance with some embodiments of the present disclosure, the formation of source/drain regions 52 includes an epitaxy growth. As illustrated in FIG. 12, due to the blocking of the remaining portions of fin spacers 50, source/drain regions 52 are first grown vertically, during which time source/drain regions 52 do not grow horizontally. After the recesses between opposite portions of fin spacers 50 are fully filled, source/drain regions 52 start to grow both vertically and horizontally. In FIG. 12, the top portions of source/drain regions 52 are illustrated as having rounded outer surfaces. In accordance with alternative embodiments, the top portions of source/drain regions 52 have slanted facets.

In accordance with some exemplary embodiments in which the resulting FinFET is an n-type FinFET, source/drain regions 52 comprise silicon phosphorous (SiP) or phosphorous-doped silicon carbon (SiCP). In accordance with alternative exemplary embodiments in which the resulting FinFET is a p-type FinFET, source/drain regions 52 comprise SiGe, and a p-type impurity such as boron or indium, which may be in-situ doped during the epitaxy.

Figure 14:
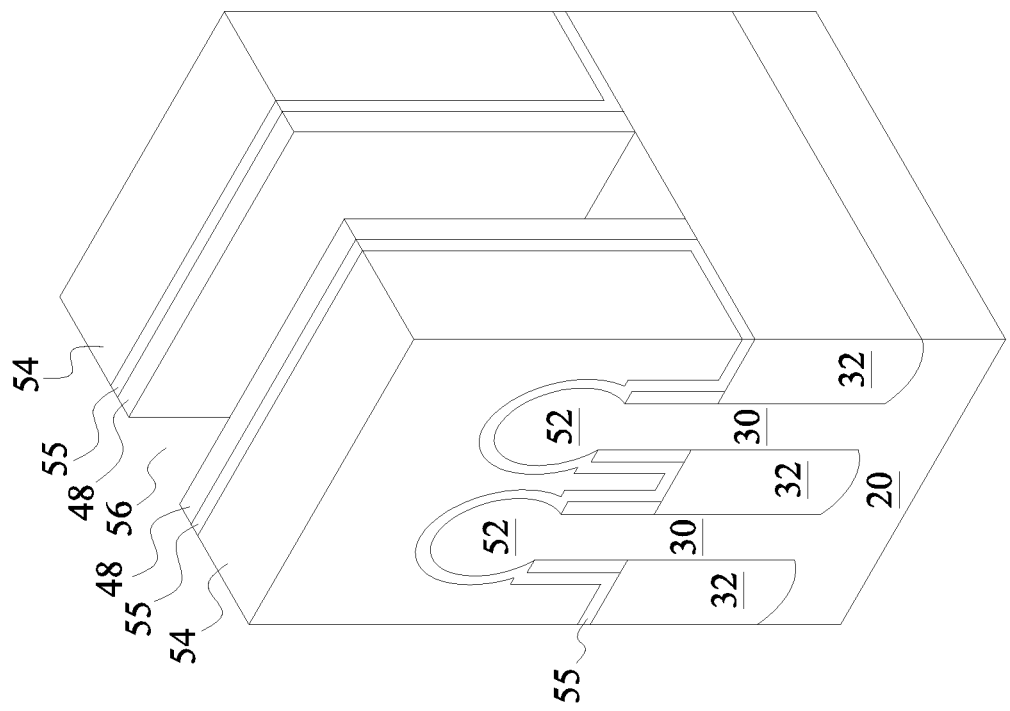
Figure 13:
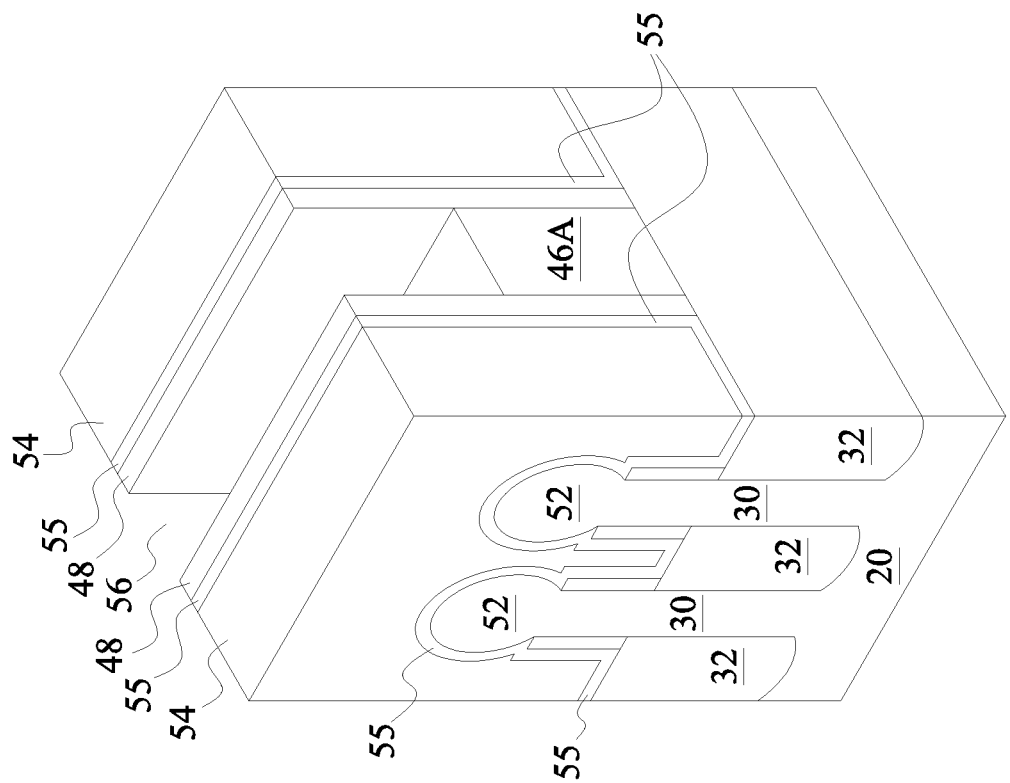

Next, as shown in FIG. 13, etch stop layer 55 is formed conformally covering the structure shown in FIG. 12. Inter-Layer Dielectric (ILD) 54 is then formed. The respective steps are shown as step 418 in the process flow shown in FIG. 32. A CMP is then performed to level the top surfaces of ILD 54, hard mask 40 (FIG. 12), and gate spacers 48 with each other. Next, dummy gate electrode 46 is etched, resulting in recess 56 as shown in FIGS. 13 and 14. Recess 56 is between opposite gate spacers 48. The respective step is shown as step 420 in the process flow shown in FIG. 32. The etching include two stages, Referring to FIG. 13, dummy gate electrode portion 46B (FIG. 12) is etched, for example, using a similar etching gas as in the step shown in FIG. 9, resulting in recess 56. Alternatively, wet etch may be used, for example, using an HF solution.

In a subsequent step, dummy gate electrode portion 46A (FIG. 13) is etched, for example, using similar etching gas as in the step shown in FIG. 10. The resulting structure is shown in FIG. 14. Alternatively, a wet etch may be used, for example, using phosphorous acid solution when dummy gate electrode portion 46A comprises silicon nitride. Recess 56 thus extends down to STI regions 32. After dummy gate electrode portion 46A is etched, dummy oxide 36 (not visible in FIG. 14, refer to FIG. 6) is exposed through recess 56.

Figure 15:
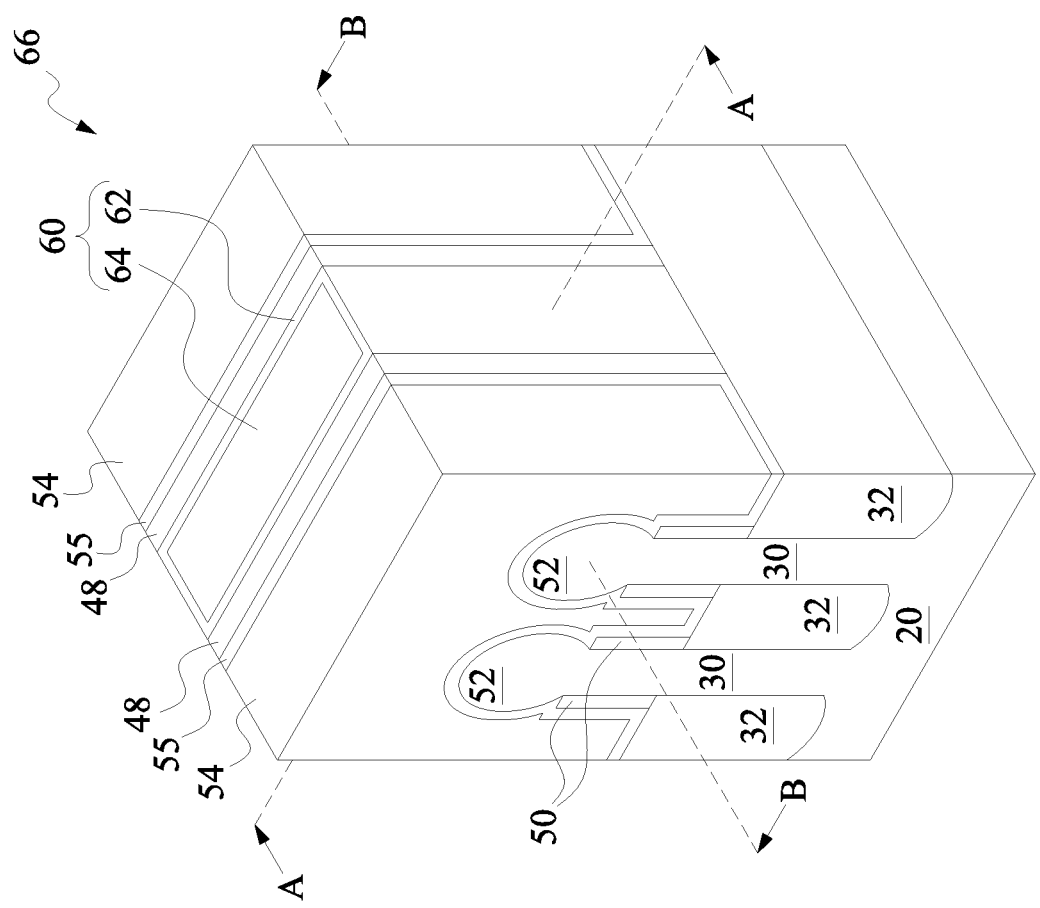

In subsequent steps, the exposed dummy oxide 36 is etched, exposing the middle portion of semiconductor fin 34 (not visible in FIG. 14). Next, replacement gate stack 60 is formed in recess 56, as shown in FIG. 15. The respective step is shown as step 422 in the process flow shown in FIG. 32. Replacement gate stack 60 may include a plurality of dielectric layers to form replacement gate dielectric 62, and a plurality of conductive layers to form replacement gate electrode 64. In accordance with some embodiments, the formation of gate dielectric 62 includes performing an interfacial (dielectric) layer, and then forming a high-k dielectric layer on the interfacial layer. The interfacial layer may include silicon oxide formed by treating the exposed surface of semiconductor fins 34 in a chemical solution, so that semiconductor fins 34 is oxidized to form a chemical oxide (silicon oxide). The high-k dielectric is then deposited on the interfacial layer. In accordance with some embodiments, the high-k dielectric has a k value greater than about 7.0, and may include a metal oxide or a silicate of Hf, Al, Zr, La, and the like.

Replacement gate electrode 64 is formed over replacement gate dielectric 62. Replacement gate electrode 64 may include a metal-containing material such as TiN, TaN, TaC, Co, Ru, Al, Cu, W, combinations thereof, or multi-layers thereof. After the formation of gate dielectric 62 and gate electrode 64, a planarization such as a CMP is performed to remove excess portions of the gate dielectric and gate electrode over ILD 54. FinFET 66 is thus formed.

FIGS. 16A through 23B illustrate the cross-sectional views of some portions of FinFET 66 in FIG. 15. FIGS. 16A, 17A, 18A, 19A, 20A, 21A, 22A, and 23A are obtained from the vertical plane containing line A-A in FIG. 15, and FIGS. 16B, 17B, 18B, 19B, 20B, 21B, 22B, and 23B are obtained from the vertical plane containing line B-B in FIG. 15. In each of FIGS. 17A through 23B, gate spacers 48 have upper portions 48B and lower portions 48A, wherein the joints between 48A and 48B are at the same level where dummy gate electrode portions 46A and 46B join with each other. In accordance with these embodiments, the joints between gate spacer portion 48A and 48B are at the level higher than the top surface of semiconductor fins 34.

Figure 16B:
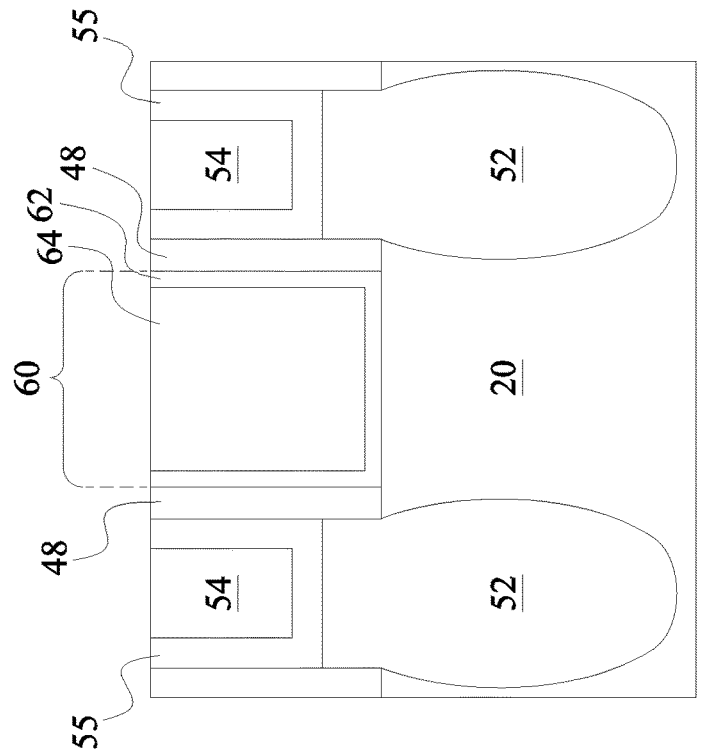
FIGS. 16A through 23B illustrate the cross-sectional views of the replacement gates of FinFETs in accordance with some embodiments.
Figure 16A:
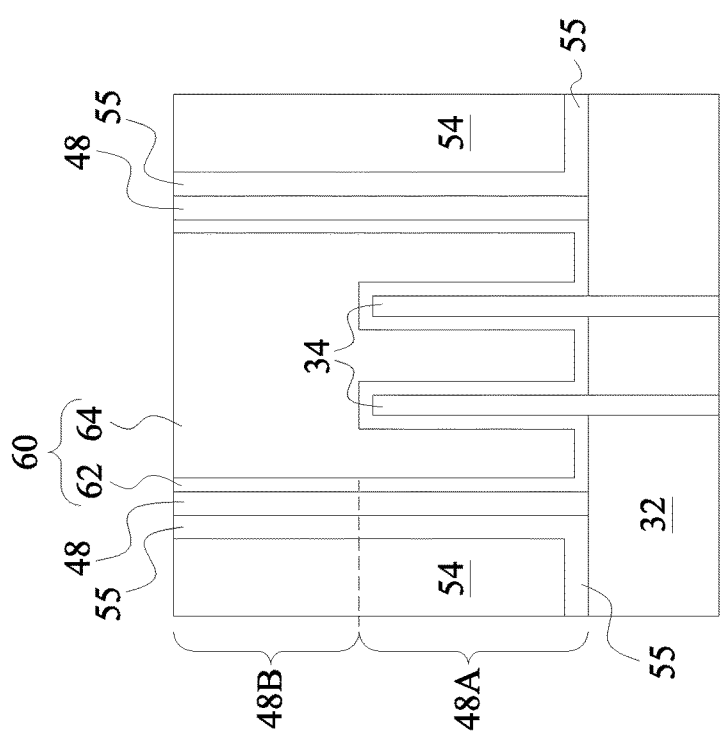

FIGS. 16A and 16B illustrate the embodiments wherein the dummy gate electrode 46 in FIGS. 10B and 11 have vertical edges, and the edges of dummy gate electrode portions 46A are vertically aligned to (co-terminus with) the respective edges of dummy gate electrode portions 46B. In addition, when dummy gate electrode portions 46A and 46B are etched as show in FIGS. 13 and 14, either the inner surface portions of gate spacers 48 facing recess 56 are substantially not etched by the etchants used in the steps shown in FIGS. 13 and 14 due to high etching selectivity values, or the upper portion 48B and lower portion 48A are etched by a same amount. Accordingly, in FIGS. 16A and 16B, upper portion 48B and the lower portion 48A of gate spacers 48 have same thicknesses.

In FIGS. 16A and 16B, upper gate spacer portion 48B and the sidewall of gate stack 60 forms a first interface, and lower gate spacer portion 48A and the sidewall of gate stack 60 forms a second interface, with the first and the second interfaces aligned to substantially a same vertical straight line (and a same vertical plane) in the cross-sectional view. In FIGS. 17A through 23B, the first interface and the second interface are not in the same substantially straight line, and not in the same vertical plane.

Figure 17B:
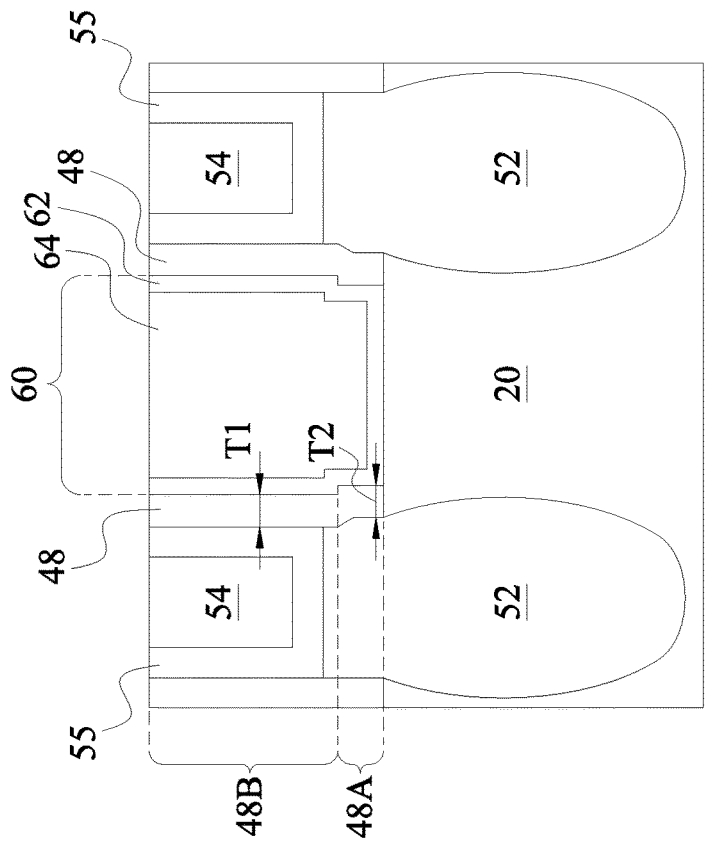
Figure 17A:
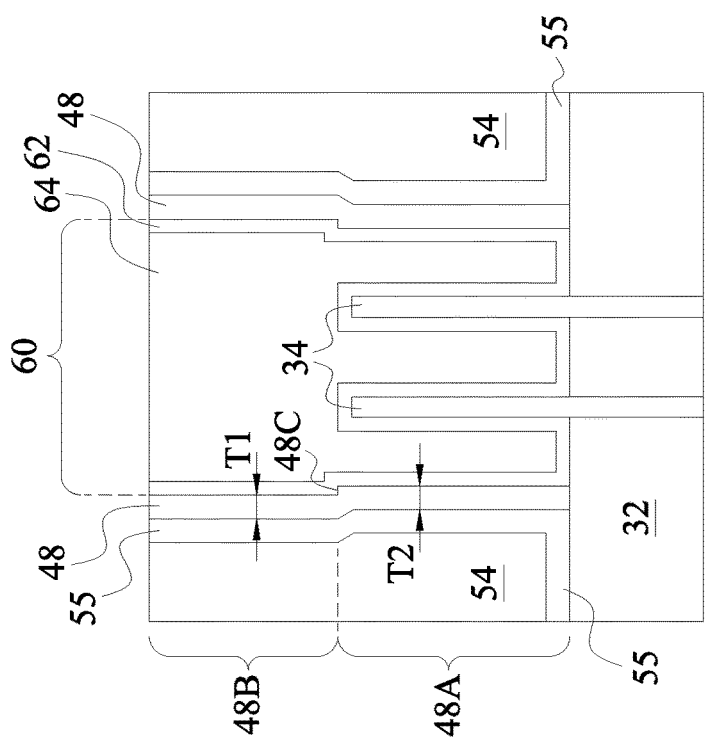

FIGS. 17A and 17B illustrate the embodiments wherein the dummy gate electrode 46 in FIGS. 10B and 11 have vertical edges, and the edges of dummy gate electrode portions 46A are recessed relative to the respective edges of dummy gate electrode portions 46B. This results in gate spacers 48 to have lower portion 48A recessed toward the vertical middle line of replacement gate 60. A step is thus formed, which step includes the inner edge of lower portion 48A and the inner edge of upper portion 48B, and top surface 48C. In addition, in FIGS. 17A and 17B, thickness T1 of upper portions 48B and thickness T2 of the lower portions 48A of gate spacers 48 are substantially equal to each other (for example, with a difference less than 10 percent of thickness T1) for same reasons as address in preceding paragraphs.

In FIGS. 17A and 17B, replacement gate dielectric 62 and replacement gate electrode 64 are illustrated as an example. In FIGS. 18A through 23B, replacement gate dielectric 62 and replacement gate electrode 64 are not shown. It is appreciated that the profile of gate dielectric 62, which is a conformal layer, will follow the profile of the inner edge of gate spacer 48, similar to what is shown in FIGS. 17A and 17B.

Figure 18B:
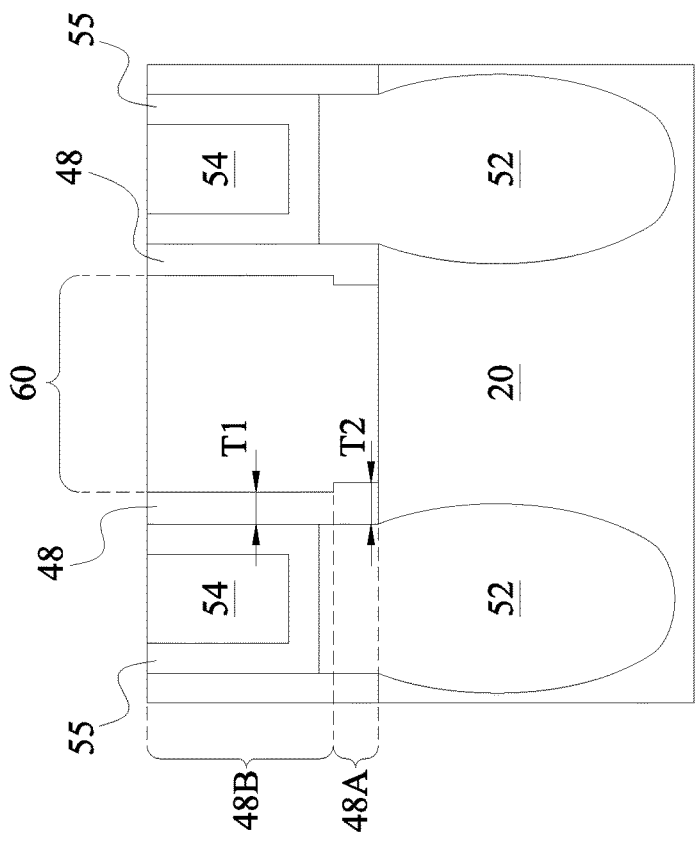
Figure 18A:
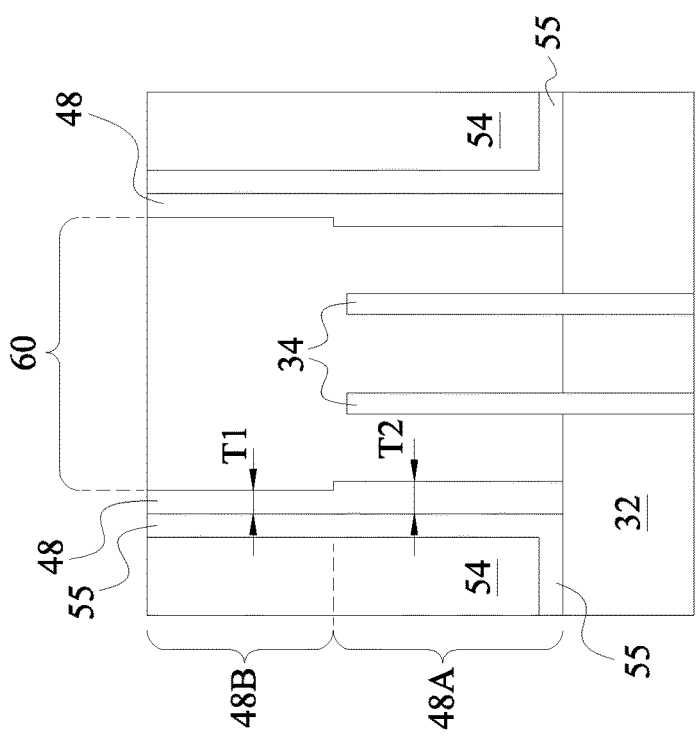

FIGS. 18A and 18B illustrate the embodiments wherein the dummy gate electrode 46 in FIGS. 10B and 11 have vertical edges, and the edges of dummy gate electrode portions 46A are vertically aligned to the respective edges of dummy gate electrode portions 46B after the step shown in FIG. 11 is finished. In the step shown in FIGS. 13 and 14, due to the fact that the etching gas for etching gate spacer portions 48B (FIGS. 13 and 14) has a higher etching rate for etching gate spacer portions 48A than the etching gas for etching gate spacer portions 48B, thickness T1 of upper portions 48B is smaller than thickness T2 of lower portions 48A of gate spacers 48.

Figure 19B:
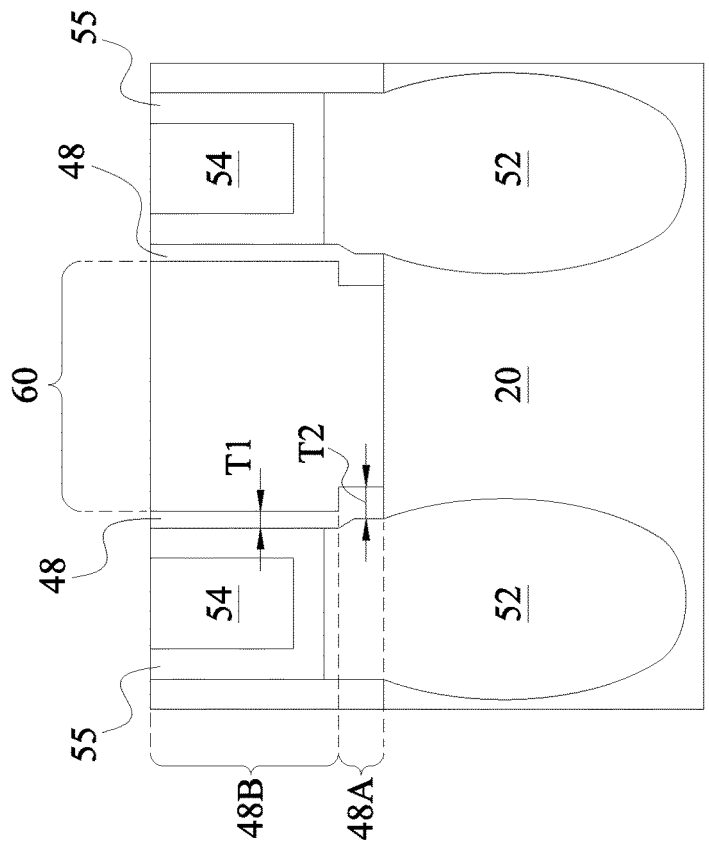
Figure 19A:
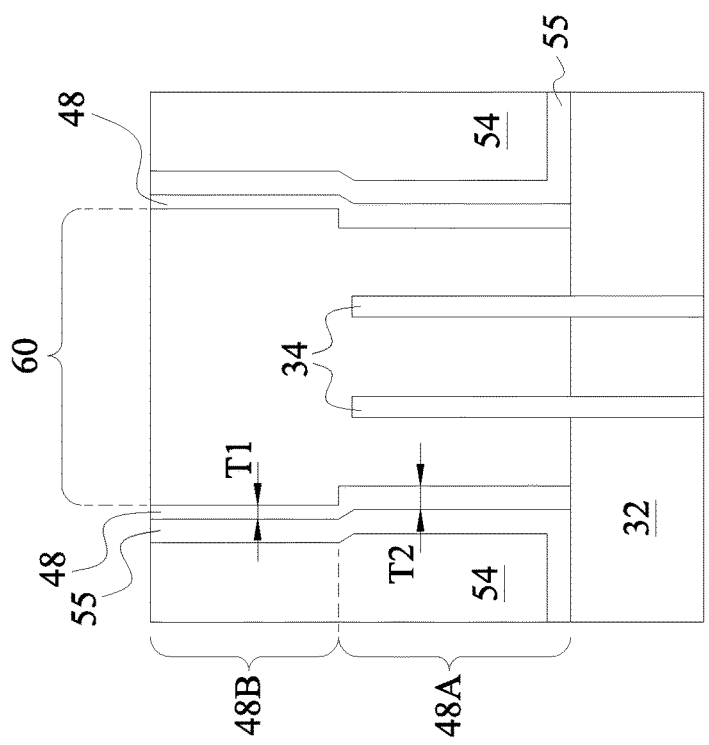

FIGS. 19A and 19B illustrate the embodiments wherein the dummy gate electrode 46 in FIGS. 10B and 11 have vertical edges, and the edges of dummy gate electrode portions 46A are recessed relative to the respective edges of dummy gate electrode portions 46B. This results in gate spacers 48 to have lower portions 48B recessed toward replacement gate 60 relative to the respective upper portions 48A. Furthermore, in the step shown in FIGS. 13 and 14, due to the fact that the etching gas for etching gate spacer portions 48B (FIGS. 13 and 14) has a higher etching rate for etching gate spacer portions 48A than the etching gas for etching gate spacer portions 48B, thickness T1 of upper portions 48B is smaller than thickness T2 of lower portions 48A of gate spacers 48.

Figure 20B:
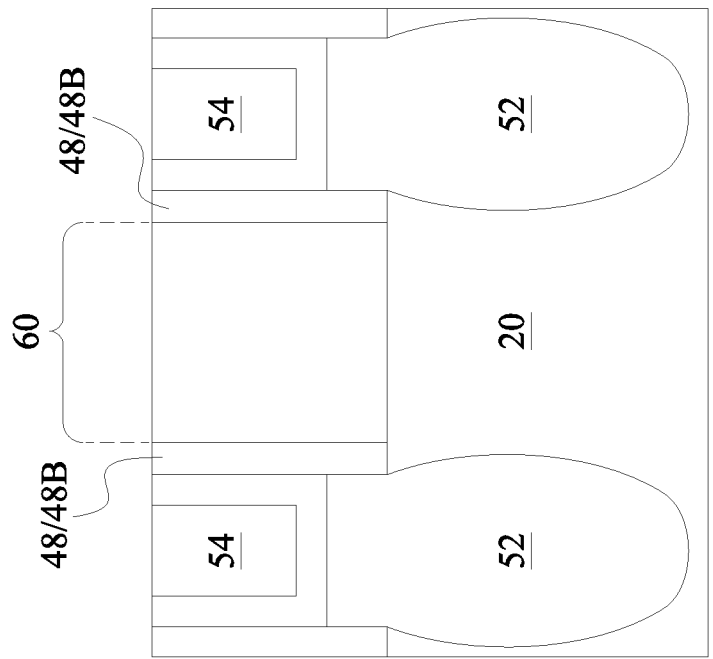
Figure 20A:
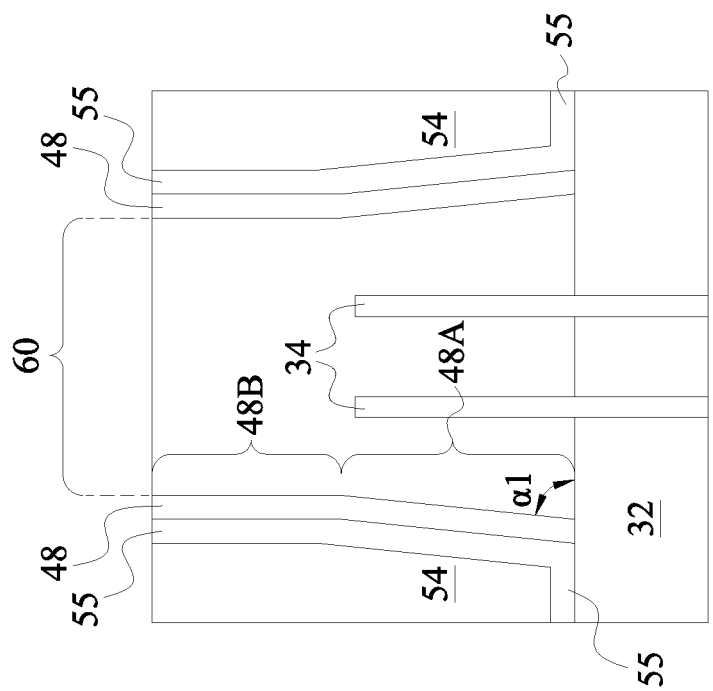
Figure 21B:
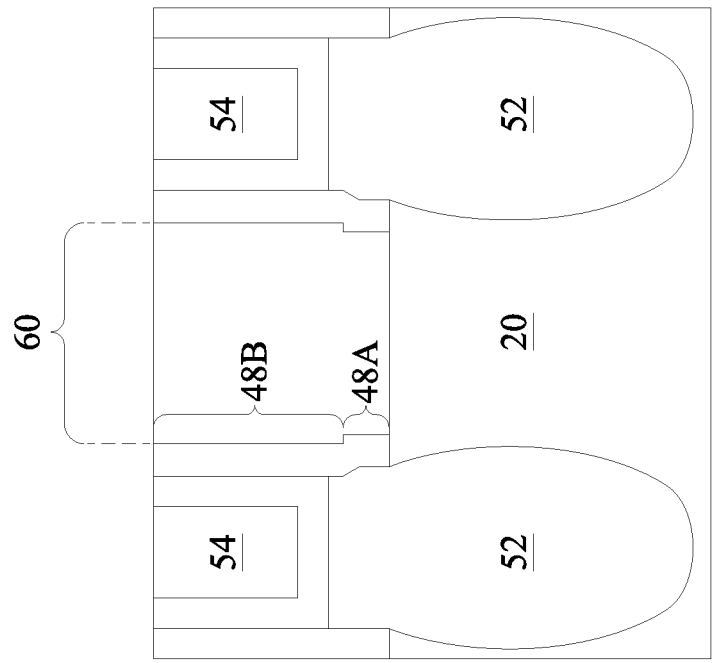
Figure 21A:
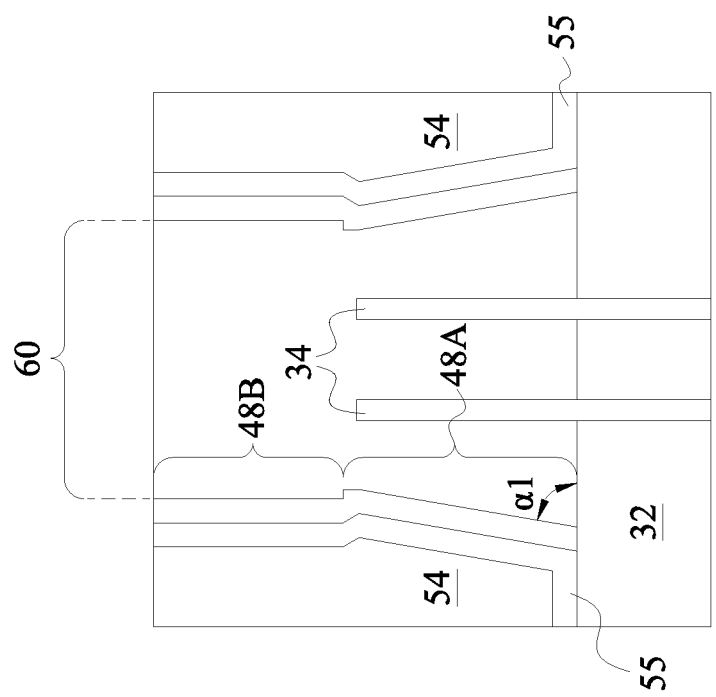
Figure 22B:
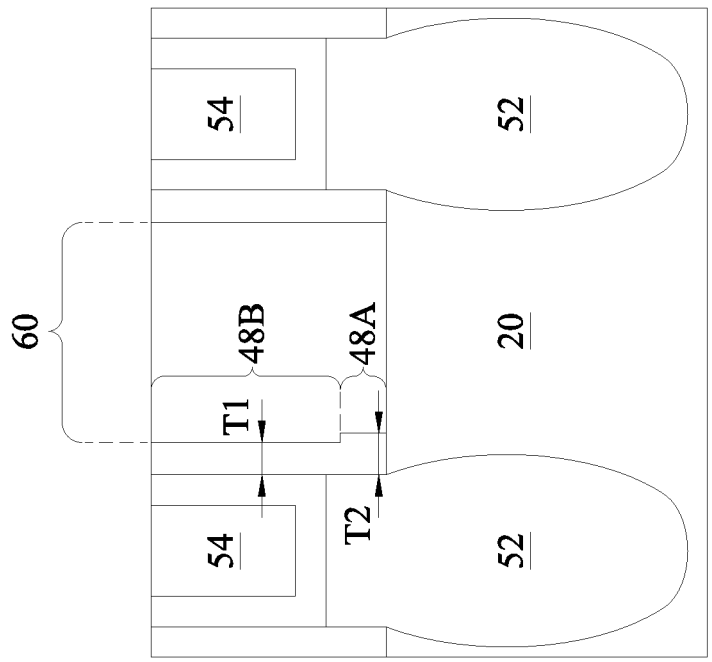
Figure 22A:
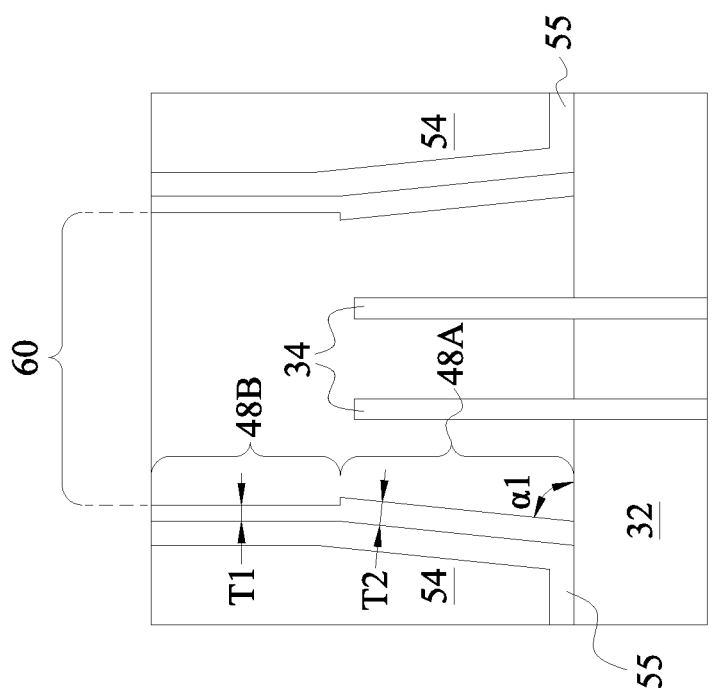
Figure 23B:
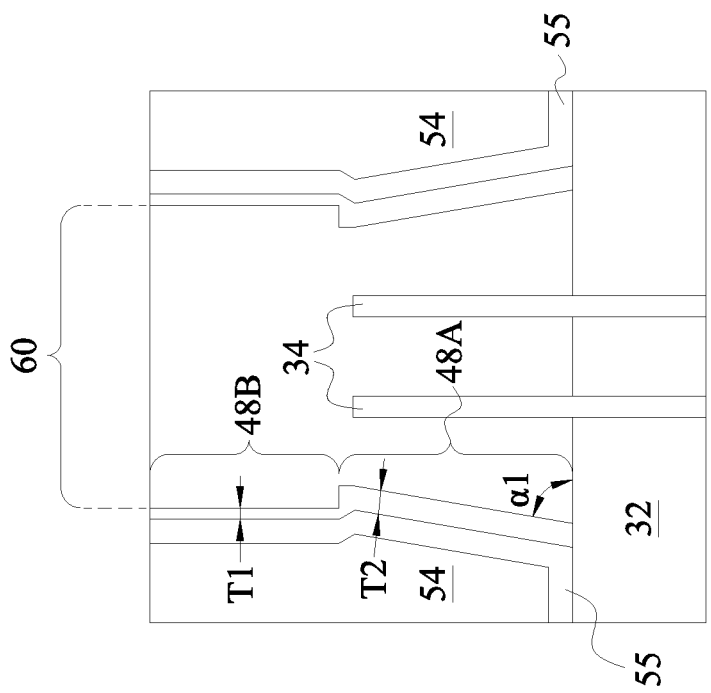
Figure 23A:
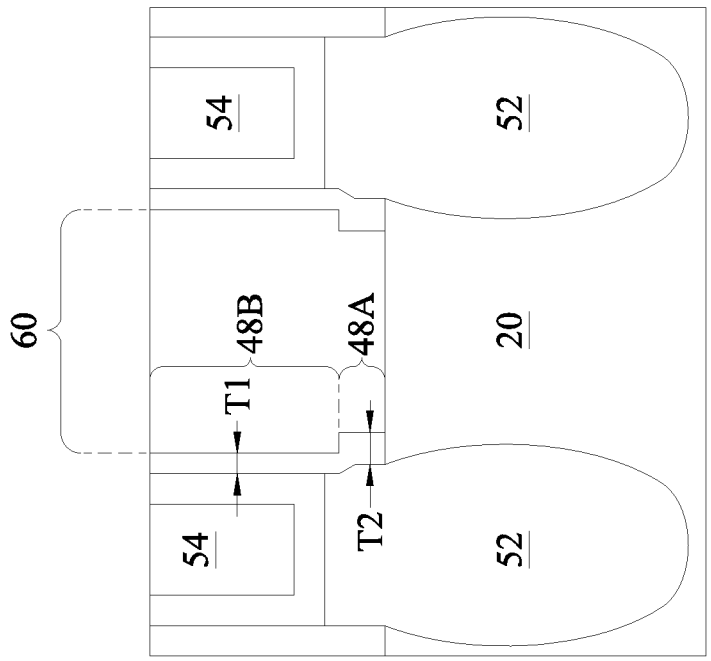

FIGS. 20A through 23B illustrate cross-sectional view of the structure shown in FIG. 15. These embodiments are similar to the embodiments shown in FIGS. 17A through 17B, except that lower portions 48A of gate spacers 48 are slanted with tilt angle α1 (refer to FIG. 10A). Otherwise, the embodiments shown in FIGS. 20A and 20B are similar to the embodiments shown in FIGS. 16A and 16B, respectively, the embodiments shown in FIGS. 21A and 21B are similar to the embodiments shown in FIGS. 17A and 17B, respectively, the embodiments shown in FIGS. 22A and 22B are similar to the embodiments shown in FIGS. 18A and 18B, respectively, and the embodiments shown in FIGS. 23A and 23B are similar to the embodiments shown in FIGS. 19A and 19B, respectively.

FIGS. 24 through 28 illustrate cross-sectional views of intermediate stages in the formation of a FinFET in accordance with alternative embodiments. Unless specified otherwise, the materials and the formation methods of the components in these embodiments are essentially the same as the like components, which are denoted by like reference numerals in the embodiments shown in FIGS. 1 through 15. The details regarding the formation process and the materials of the components shown in FIGS. 24 through 28 may thus be found in the discussion of the embodiment shown in FIGS. 1 through 15.

Figure 25:
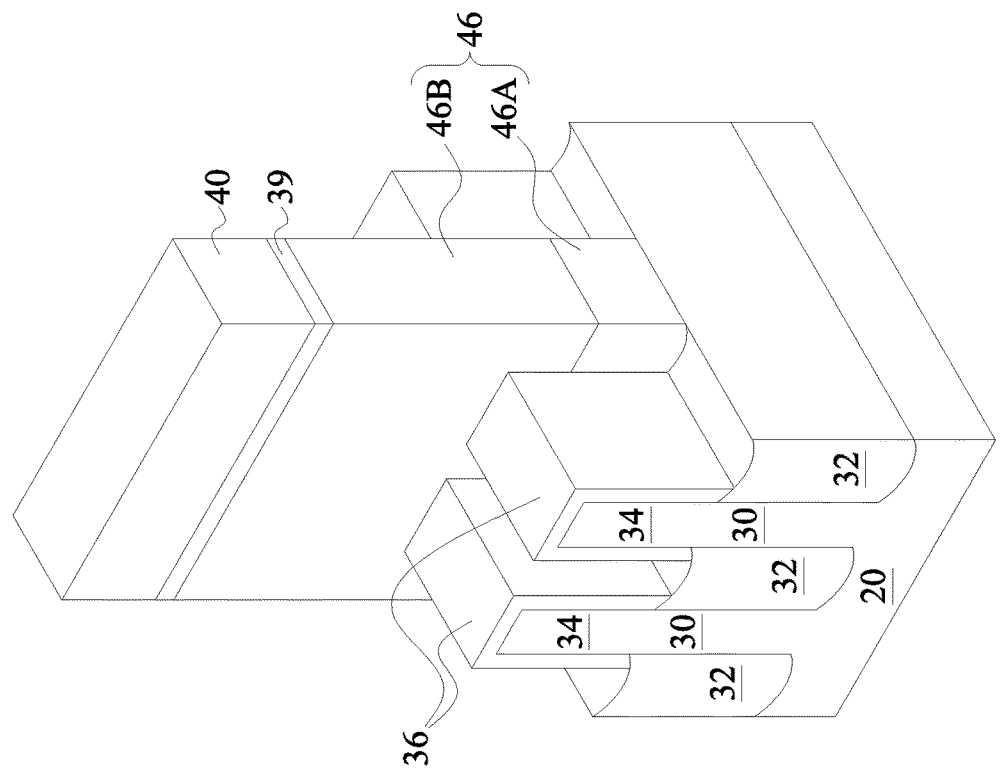
FIGS. 24 through 28 are perspective views and cross-sectional views of intermediate stages in the formation of a FinFET in accordance with some embodiments.
Figure 24:
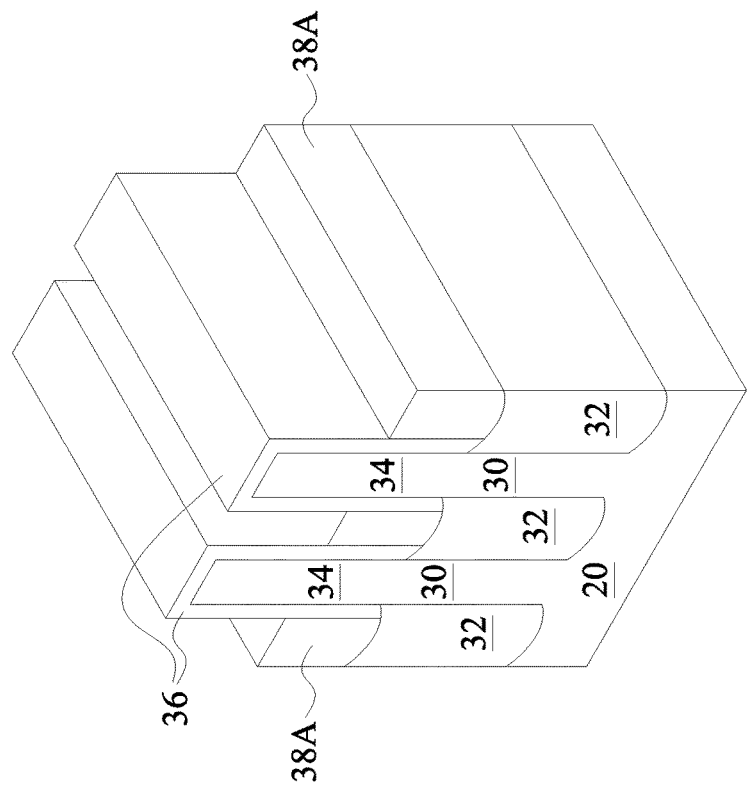
Figure 26:
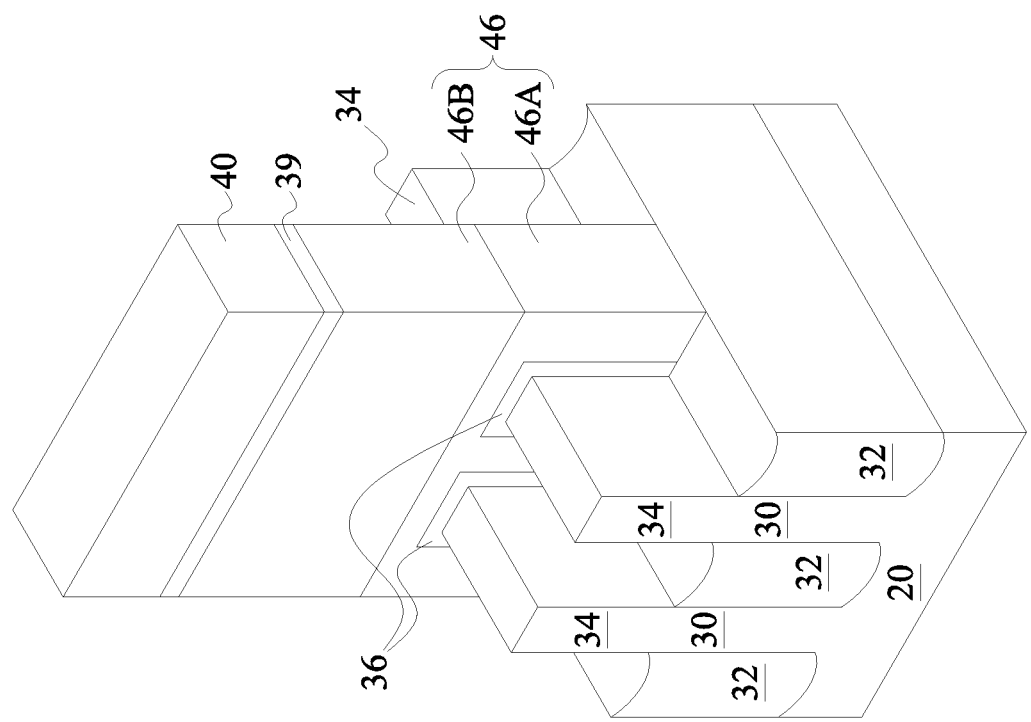

The initial steps of these embodiments are essentially the same as shown in FIGS. 1 through 7. Next, as shown in FIG. 24, dummy gate electrode layer 38A is etched back, and the top surface of remaining gate electrode layer 38A is lower than the top surface of dummy oxide 36, and the top surfaces of semiconductor fins 34. Next, gate electrode layer 38B is formed, and is planarized to have a top surface, followed by the two-step etching process as shown in FIGS. 8, 9, and 10A. The resulting structure is shown in FIG. 25. In the resulting structure, the recessing of lower gate spacer portions 48A, the tilting of lower gate spacer portions 48A, etc., as discussed referring to FIG. 10A, may or may not occur similar to the embodiments shown in FIG. 10A. Furthermore, in the resulting structure, the interfaces between dummy gate electrode portions 46A and dummy gate electrode portions 46B are lower than the top surface of dummy oxide 36 and the top surfaces of semiconductor fins 34.

Figure 27:
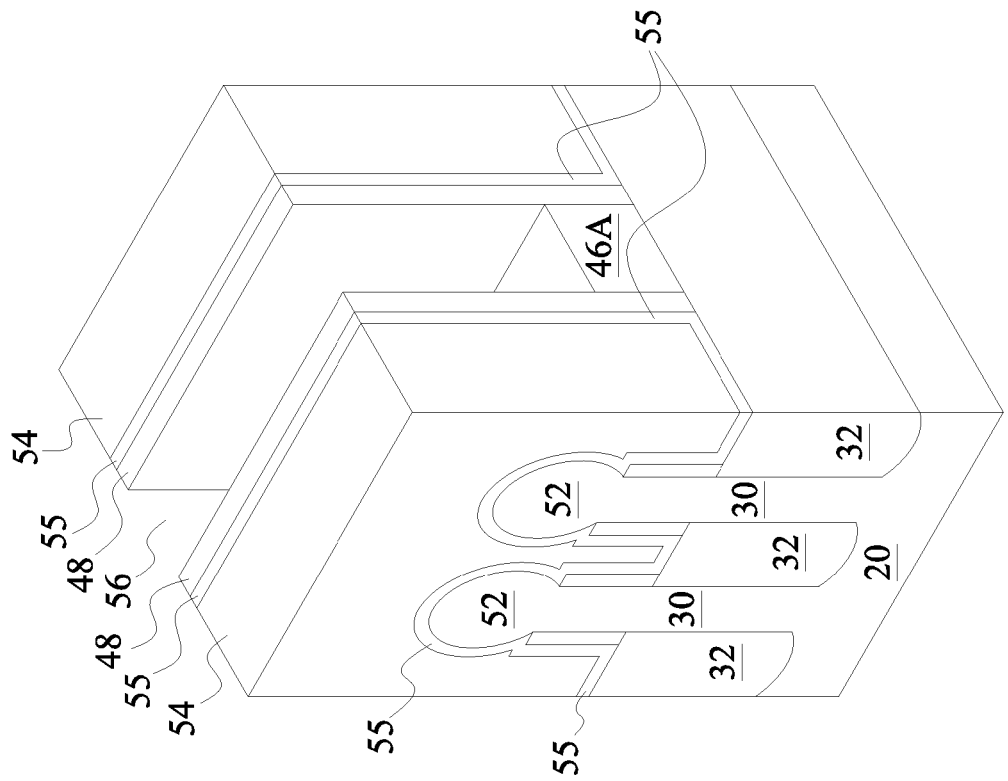
Figure 28:
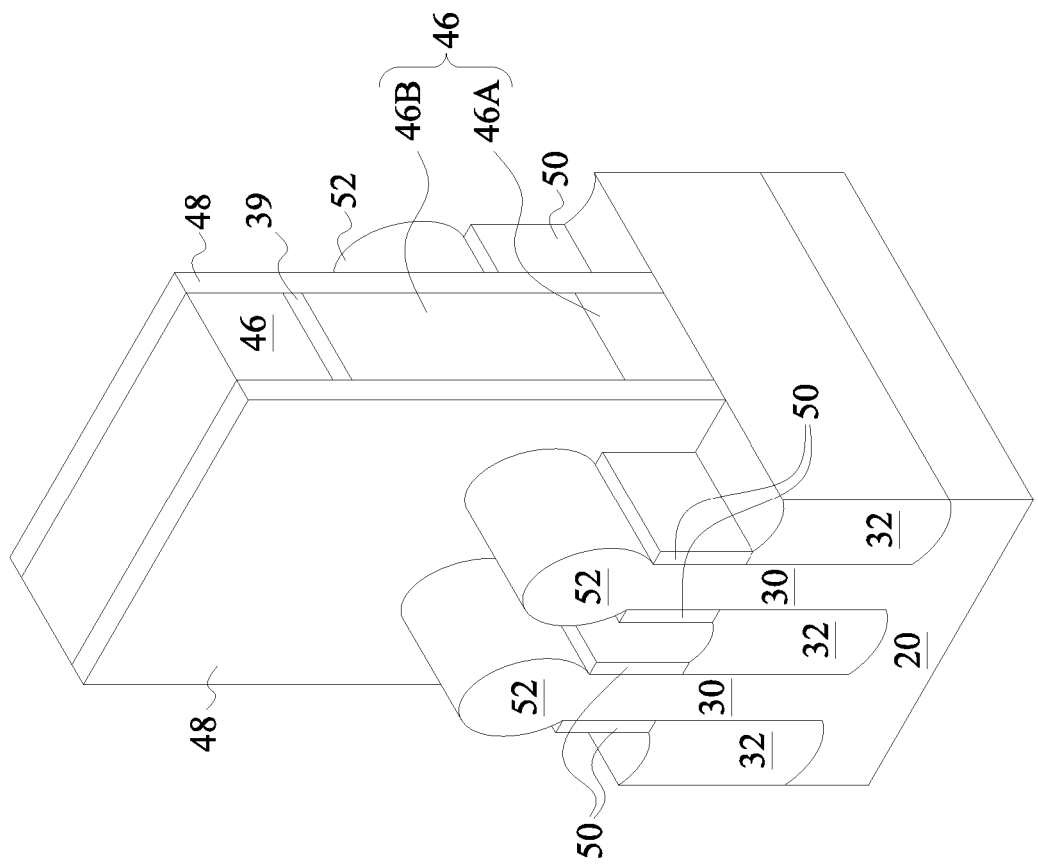

The subsequent steps are essentially the same as shown in FIGS. 11 through 15. For example, in FIG. 26, the exposed portions of dummy oxide 36 are etched, exposing semiconductor fins 34. In FIG. 27, gate spacers 48 and fin spacers 50 are formed, followed by the etching of the end portions of semiconductor fins 34 and the formation of source/drain regions 52. In FIG. 28, etch stop layer 55 and ILD 54 are formed and planarized, followed by the removal of top surface of dummy gate electrode portions 46B, as shown in FIG. 28. Next, dummy gate electrode portions 46A are removed, and the resulting structure is the same as shown in FIG. 14. The subsequent process steps and the structures are similar to what are shown in FIG. 15, and hence are not repeated herein. The resulting FinFET 66 is also similar to what is shown in FIG. 15.

Figure 29B:
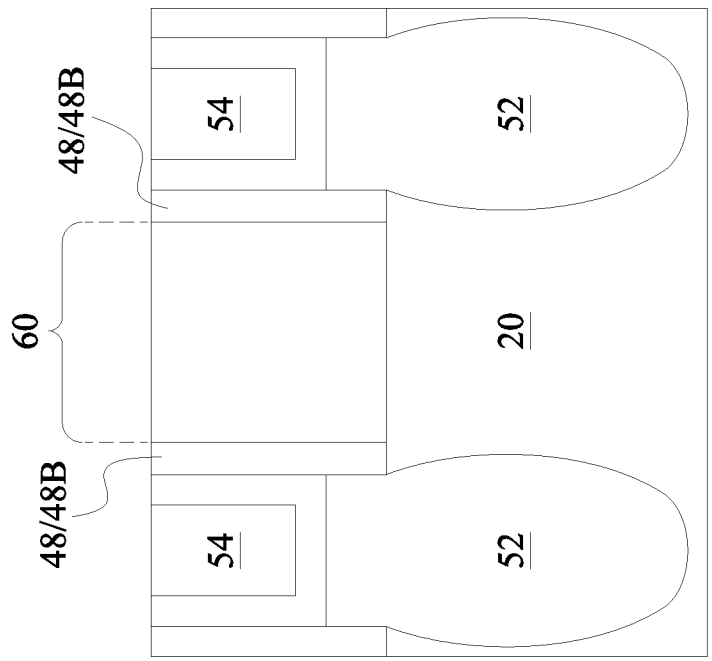
FIGS. 29A through 31B illustrate the cross-sectional views of the replacement gates of FinFETs in accordance with some embodiments.
Figure 29A:
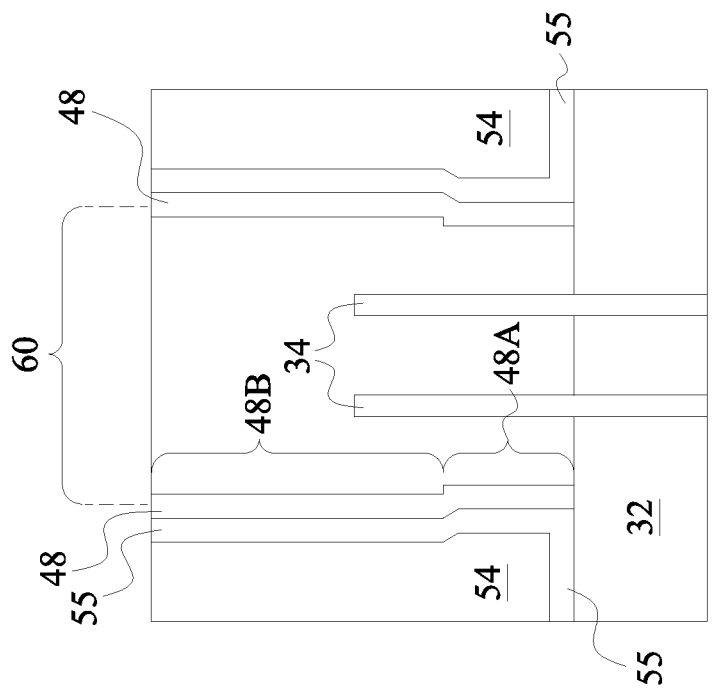
Figure 30B:
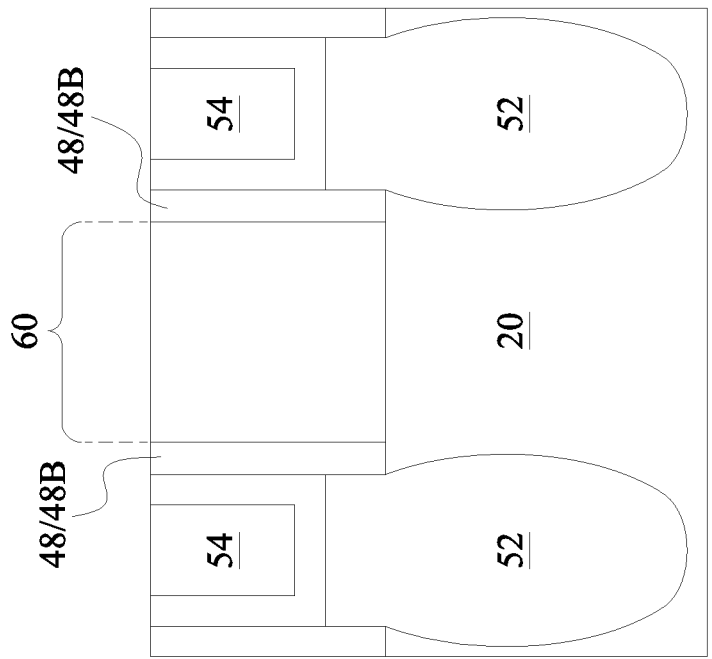
Figure 30A:
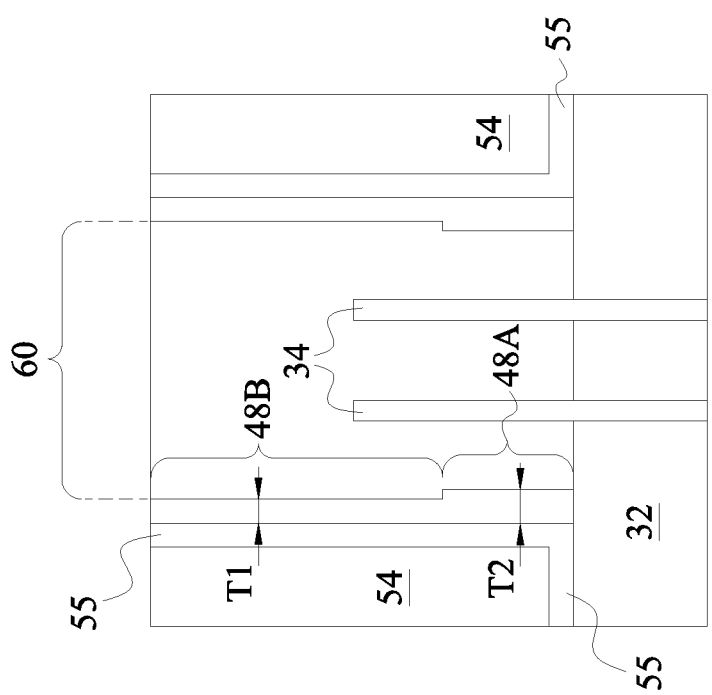
Figure 31B:
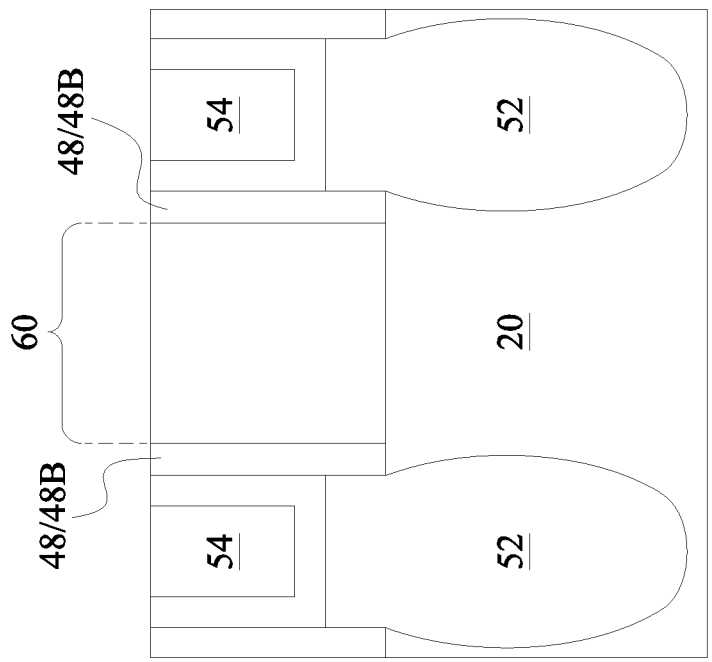
Figure 31A:
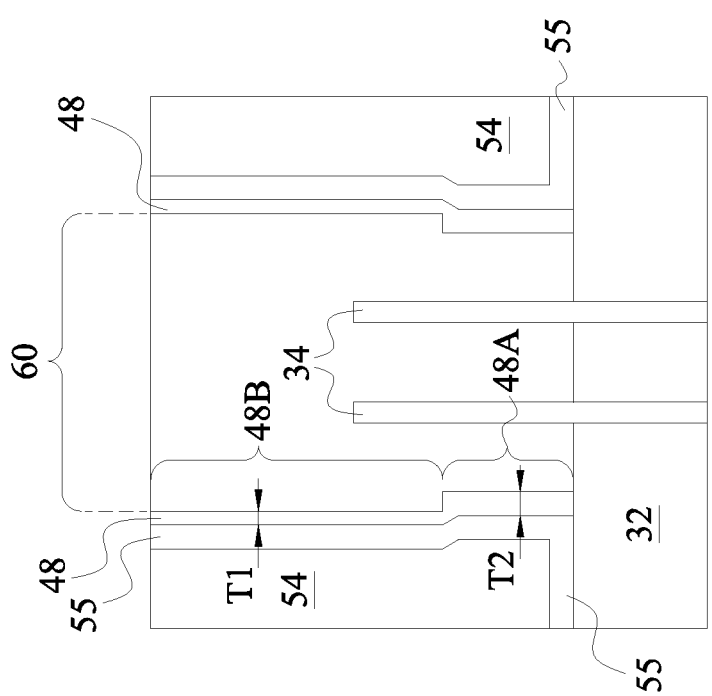

FIGS. 29A through 31B illustrate the cross-sectional views of some portions of FinFET 66 in FIG. 15. FIGS. 29A, 30A, and 31A are obtained from the vertical plane containing line A-A in FIG. 15, and FIGS. 29B, 30B, and 31B are obtained from the vertical plane containing line B-B in FIG. 15. In FIGS. 29A through 31B, gate spacers 48 have upper portions 48B and lower portions 48A, wherein the joints between gate spacer portion 48A and 48B are at the same level where dummy gate electrode portions 46A and 46B join with each other. In accordance with these embodiments, the joints between gate spacer portion 48A and 48B are at the level lower than the top surface of semiconductor fins 34. It is realized that the lower dummy gate electrode portions 46A are difficult to form (hard to pattern in the step shown in FIG. 10A) and hard to remove (in the steps shown in FIG. 14). Accordingly, by make dummy gate electrode portion 46A to be thinner, the process difficulty is reduced, and the profile of the resulting replacement gates and gate spacers may be improved.

The embodiments shown in FIGS. 29A through 31B are similar to the embodiments shown in FIGS. 17A through 19B, except in FIGS. 29A through 31B, the joints between gate spacer portions 48A and 48B are at the level lower than the top surface of semiconductor fins 34. The details of these embodiments are thus not repeated herein. In addition, by adopting the embodiments as shown in FIGS. 24 through 28, the lower portions of gate spacers 48 may also be slanted. The corresponding structures are similar to what are shown in FIGS. 20A through 23B, except the joints of gate spacer portions 48A and 48B are lower than the top surfaces of semiconductor fins 34.

The embodiments of the present disclosure have some advantageous features. By using two-step dummy gate electrode formation, the strength of the dummy gate electrodes is improved. Experiment results indicated that when the dummy gate electrodes are formed of polysilicon, the neighboring ones of the polysilicon dummy gate electrodes, when having very high aspect ratio, may tilt and stick to each other, resulting in yield loss or performance degradation. By replacing the lower dummy gate electrode materials with selected materials other than polysilicon, the strength of the dummy gate electrodes is improved, and the dummy gate electrodes suffer significant lower rate of falling and sticking, as revealed by experiments.

In accordance with some embodiments of the present disclosure, a method includes forming isolation regions extending into a semiconductor substrate, and recessing the isolation regions. A portion of the semiconductor substrate between the isolation regions protrudes higher than the isolation regions to form a semiconductor fin. A dummy gate electrode is formed to cover a middle portion of the semiconductor fin, with an end portion of the semiconductor fin uncovered by the dummy gate electrode. The dummy gate electrode includes a lower dummy gate electrode portion, and an upper dummy gate electrode portion including polysilicon over the lower dummy gate electrode portion. The lower dummy gate electrode portion and the upper dummy gate electrode portion are formed of different materials. Source/drain regions are formed on opposite sides of the dummy gate electrode. The dummy gate electrode is replaced with a replacement gate electrode.

In accordance with some embodiments of the present disclosure, a method includes forming a dummy oxide layer contacting a top surface and sidewalls of a semiconductor fin, forming a lower dummy gate electrode layer over the dummy oxide layer, planarizing the lower dummy gate electrode layer, and forming an upper dummy gate electrode layer over the planarized lower dummy gate electrode layer. The upper dummy gate electrode layer includes polysilicon. The method further includes performing a first etching step to etch the upper dummy gate electrode layer using a first etching gas, and performing a second etching step to etch the lower dummy gate electrode layer using a second etching gas different from the first etching gas. The remaining portions of the upper dummy gate electrode layer and the lower dummy gate electrode layer in combination form a dummy gate electrode. The method further includes forming gate spacers on opposite sidewalls of the dummy gate electrode, forming an ILD on opposite sides of the dummy gate electrode, and replacing the dummy gate electrode with a replacement gate.

In accordance with some embodiments of the present disclosure, a device includes a semiconductor substrate, isolation regions extending into the semiconductor substrate, and a semiconductor fin between opposite portions of the isolation regions. The semiconductor fin is higher than top surfaces of the isolation regions. The device further includes a gate stack on a top surface and opposite sides of the semiconductor fin, and a gate spacer contacting a sidewall of the gate stack. The gate spacer includes a lower portion having a first inner edge contacting a sidewall of the gate stack, and an upper portion over the lower portion. The upper portion has a second inner edge contacting the sidewall of the gate stack, and the first inner edge and the second inner edge are misaligned.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming isolation regions extending into a semiconductor substrate;
   recessing the isolation regions, wherein a portion of the semiconductor substrate between the isolation regions protrudes higher than the isolation regions to form a semiconductor fin;
   forming a dummy gate electrode covering a first portion of the semiconductor fin, with a second portion of the semiconductor fin uncovered by the dummy gate electrode, wherein the dummy gate electrode comprises:
      a lower dummy gate electrode portion; and
      an upper dummy gate electrode portion comprising polysilicon over the lower dummy gate electrode portion, wherein the lower dummy gate electrode portion and the upper dummy gate electrode portion are formed of different materials;
   forming source/drain regions on opposite sides of the dummy gate electrode; and
   replacing the dummy gate electrode with a replacement gate electrode.

2. The method of claim 1 further comprising:
   forming a lower dummy gate electrode layer;
   planarizing the lower dummy gate electrode layer;
   forming an upper dummy gate electrode layer over the planarized lower dummy gate electrode layer; and
   patterning the upper dummy gate electrode layer and the lower dummy gate electrode layer using a same etching mask to form the upper dummy gate electrode portion and the lower dummy gate electrode portion, respectively.

3. The method of claim 2 further comprising:
   etching back the planarized lower dummy gate electrode layer until a top surface of the lower dummy gate electrode layer is lower than a top surface of the semiconductor fin.

4. The method of claim 2, wherein the forming the lower dummy gate electrode layer comprises atomic layer deposition, and the forming the upper dummy gate electrode layer comprises chemical vapor deposition.

5. The method of claim 2, wherein the forming the lower dummy gate electrode layer comprises spin coating, and the forming the upper dummy gate electrode layer comprises chemical vapor deposition.

6. The method of claim 2, wherein the upper dummy gate electrode layer and the lower dummy gate electrode layer are patterned through etching using different etching gases.

7. The method of claim 2, wherein the upper dummy gate electrode layer and the lower dummy gate electrode layer are patterned through etching using a same etching gas.

8. A method comprising:
  forming a dummy oxide layer contacting a top surface and sidewalls of a semiconductor fin;
  forming a lower dummy gate electrode layer over the dummy oxide layer;
  planarizing the lower dummy gate electrode layer;
  forming an upper dummy gate electrode layer over the planarized lower dummy gate electrode layer, wherein the upper dummy gate electrode layer comprises polysilicon;
  performing a first etching step to etch the upper dummy gate electrode layer using a first etching gas;
  performing a second etching step to etch the lower dummy gate electrode layer using a second etching gas different from the first etching gas, wherein remaining portions of the upper dummy gate electrode layer and the lower dummy gate electrode layer in combination form a dummy gate electrode;
  forming gate spacers on opposite sidewalls of the dummy gate electrode;
  forming an Inter-layer Dielectric (ILD) on opposite sides of the dummy gate electrode; and
  replacing the dummy gate electrode with a replacement gate.

9. The method of claim 8 further comprising:
  etching back the planarized lower dummy gate electrode layer, with the upper dummy gate electrode layer being formed over the etched-back lower dummy gate electrode layer.

10. The method of claim 9, wherein the planarized lower dummy gate electrode layer is etched back until a top surface of the lower dummy gate electrode layer is lower than the top surface of the semiconductor fin.

11. The method of claim 8, wherein after the replacing the dummy gate electrode with the replacement gate, portions of the gate spacers remain.

12. The method of claim 8, wherein the forming the lower dummy gate electrode layer comprises depositing silicon nitride using atomic layer deposition.

13. The method of claim 8, wherein the forming the lower dummy gate electrode layer comprises depositing carbon using spin coating.

14. The method of claim 8, wherein the forming the lower dummy gate electrode layer comprises forming spin-on glass.

15. A method comprising:
  recessing isolation regions, so that a portion of a semiconductor substrate between the isolation regions protrudes higher than the isolation regions to form a semiconductor fin;
  depositing a lower dummy gate electrode layer cover the semiconductor fin, wherein the lower dummy gate electrode layer has a planar top surface;
  depositing an upper dummy gate electrode layer over the lower dummy gate electrode layer;
  etching the upper dummy gate electrode layer and the lower dummy gate electrode layer to form a dummy gate electrode having an upper dummy gate electrode portion and a lower dummy gate electrode portion, respectively, wherein the dummy gate electrode covers a first portion of the semiconductor fin, with a second portion of the semiconductor fin uncovered by the dummy gate electrode;
  forming source/drain regions on opposite sides of the dummy gate electrode; and
  replacing the dummy gate electrode with a replacement gate electrode.

16. The method of claim 15, wherein the upper dummy gate electrode layer and the lower dummy gate electrode layer are etched using a same etching mask, and the upper dummy gate electrode layer and the lower dummy gate electrode layer are etched in different etching steps.

17. The method of claim 16, wherein the upper dummy gate electrode layer and the lower dummy gate electrode layer are etched using different etching gases.

18. The method of claim 15 further comprising:
  etching back the lower dummy gate electrode layer until a top surface of the lower dummy gate electrode layer is lower than a top surface of the semiconductor fin.

19. The method of claim 15, wherein the lower dummy gate electrode layer is deposited using atomic layer deposition, and the upper dummy gate electrode layer is deposited using chemical vapor deposition.

20. The method of claim 15, wherein the lower dummy gate electrode layer is deposited using spin coating, and the upper dummy gate electrode layer is deposited using chemical vapor deposition.

* * * * *